United States Patent
Higashi et al.

(10) Patent No.: US 8,680,604 B2
(45) Date of Patent: Mar. 25, 2014

(54) NONVOLATILE SEMICONDUCTOR MEMORY DEVICE AND METHOD OF MANUFACTURING THE SAME

(75) Inventors: Kazuyuki Higashi, Yokohama (JP); Tsuneo Uenaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 852 days.

(21) Appl. No.: 12/706,195

(22) Filed: Feb. 16, 2010

(65) Prior Publication Data

US 2010/0207186 A1 Aug. 19, 2010

(30) Foreign Application Priority Data

Feb. 17, 2009 (JP) ................. 2009-033974

(51) Int. Cl.
*H01L 29/792* (2006.01)

(52) U.S. Cl.
USPC .......................................................... 257/324

(58) Field of Classification Search
USPC .......................................................... 257/324
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 2007/0252201 A1 | 11/2007 | Kito et al. | |
| 2008/0067583 A1* | 3/2008 | Kidoh et al. | 257/326 |
| 2010/0207186 A1 | 8/2010 | Higashi et al. | |

FOREIGN PATENT DOCUMENTS

| | | |
|---|---|---|
| JP | 2007-266143 | 10/2007 |
| JP | 2008-258458 | 10/2008 |
| JP | 2010-93269 A | 4/2010 |
| KR | 10-2007-0096972 | 10/2007 |
| WO | WO 2008/126774 A1 | 10/2008 |

OTHER PUBLICATIONS

Office Action issued in May 30, 2011 in Korean Patent Application No. 10-2010-13777 (with English translation).
U.S. Appl. No. 12/561,451, filed Sep. 17, 2009, Hiroyasu Tanaka, et al.
U.S. Appl. No. 13/043,714, filed Mar. 9, 2011, Katsumata, et al.
U.S. Appl. No. 13/422,000, filed Mar. 16, 2012, Iino.
Japanese Office Action issued May 28, 2013 in Patent Application No. 2009-033974 with English Translation.

* cited by examiner

*Primary Examiner* — Jae Lee
(74) *Attorney, Agent, or Firm* — Oblon, Spivak, McClelland, Maier & Neustadt, L.L.P.

(57) ABSTRACT

A first region comprises: a semiconductor layer including a columnar portion, a charge storage layer, and a plurality of first conductive layers. The second region comprises: a plurality of second conductive layers formed in the same layer as the plurality of first conductive layers. The plurality of first conductive layers configure a stepped portion at an end vicinity of the first region. The stepped portion is formed in a stepped shape such that positions of ends of the plurality of first conductive layers differ from one another. The plurality of second conductive layers is formed such that positions of ends thereof at an end vicinity of the second region surrounding the first region are aligned in substantially the perpendicular direction to the substrate.

9 Claims, 29 Drawing Sheets perspective view as seen from the
direction of the arrows C-C' perspective view as seen from the
direction of the arrows D-D' perspective view as seen from the direction of the arrows D-D'
(having a portion thereof omitted)

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from prior Japanese Patent Application No. 2009-33974, filed on Feb. 17, 2009, the entire contents of which are incorporated herein by reference.

BACKGROUND

In recent years, there are proposed many semiconductor memory devices in which memory cells are disposed three-dimensionally in order to increase a degree of integration of memory.

One conventional semiconductor memory device in which memory cells are disposed three-dimensionally uses a transistor with a cylindrical column type structure (refer to Japanese Unexamined Patent Application Publication No. 2007-266143; U.S. Pat. Nos. 5,599,724; and 5,707,885). The semiconductor memory device using the transistor with a cylindrical column type structure is provided with a stacked conductive layer stacked in multiple layers and configured to form a gate electrode, and a pillar-shaped columnar semiconductor. The columnar semiconductor functions as a channel (body) portion of the transistor. A vicinity of the columnar semiconductor is provided with a memory gate insulating layer capable of storing a charge. A configuration including these stacked conductive layer, columnar semiconductor, and memory gate insulating layer is called a memory string.

To achieve conduction with a peripheral circuit in a semiconductor memory device having the above-described memory string, a contact plug is formed extending in a stacking direction (direction perpendicular to a substrate) from the stacked conductive layer. To form the contact plug, the stacked conductive layer is formed in a stepped shape. However, for reasons of limiting a number of manufacturing steps, the stacked conductive layer in a conventional semiconductor memory device has a region other than a region functioning as the memory string also formed in a stepped shape, making it difficult to reduce an occupied area of the semiconductor memory device.

SUMMARY

In accordance with a first aspect of the present invention, a nonvolatile semiconductor memory device comprises: a first region configured to function as a plurality of memory strings, each of which has a plurality of electrically rewritable memory cells connected in series; and a second region provided in a periphery of the first region, the first region comprising: a semiconductor layer including a columnar portion extending in a perpendicular direction with respect to a substrate; a charge storage layer formed on a side surface of the columnar portion; and a plurality of first conductive layers formed on the charge storage layer, and configured to function as a control electrode of the memory cells, and the second region comprising: a plurality of second conductive layers formed in the same layer as the plurality of first conductive layers, the plurality of first conductive layers configuring a stepped portion at an end vicinity of the first region, the stepped portion being formed in a stepped shape such that a positions of ends of the plurality of first conductive layers differ from one another, and the plurality of second conductive layers being formed such that a positions of ends thereof at an end vicinity of the second region surrounding the first region are aligned in substantially the perpendicular direction to the substrate.

In accordance with a second aspect of the present invention, a nonvolatile semiconductor memory device comprises: a first region configured to function as a plurality of memory strings, each of which has a plurality of electrically rewritable memory cells connected in series, the first region comprising: a semiconductor layer including a columnar portion extending in a perpendicular direction with respect to a substrate; a charge storage layer formed on a side surface of the columnar portion; a plurality of conductive layers formed on the charge storage layer, and configured to function as a control electrode of the memory cells; a stepped portion having the plurality of conductive layers formed in a stepped shape such that positions of ends of the plurality of conductive layers differ from one another; and a wall portion provided adjacently to the stepped portion and formed by the plurality of conductive layers such that positions of ends of the plurality of conductive layers are aligned in substantially the perpendicular direction to the substrate.

In accordance with a third aspect of the present invention, a method of manufacturing a nonvolatile semiconductor memory device, the nonvolatile semiconductor memory device including a first region configured to function as a plurality of memory strings, each of which has a plurality of electrically rewritable memory cells connected in series, and a second region provided in a periphery of the first region, comprises: depositing a plurality of conductive layers on a substrate; dividing the plurality of conductive layers to form a plurality of first conductive layers positioned in the first region and a plurality of second conductive layers positioned in the second region; penetrating the plurality of first conductive layers to form a penetration hole; forming a charge storage layer in a side surface of the penetration hole; forming a first semiconductor layer so as to fill the penetration hole; and forming the plurality of first and second conductive layers such that, at an end vicinity of the first region, the plurality of first conductive layers configure a stepped portion formed in a stepped shape such that positions of ends of the plurality of first conductive layers differ from one another, and such that, at an end vicinity of the second region surrounding the first region, the plurality of second conductive layers have positions of ends thereof aligned in a substantially the perpendicular direction to the substrate.

DETAILED DESCRIPTION

Embodiments of a nonvolatile semiconductor memory device in accordance with the present invention are described below with reference to the drawings.

[First Embodiment]

(Configuration of a Nonvolatile Semiconductor Memory Device 100 in Accordance with a First Embodiment)

Figure 1:
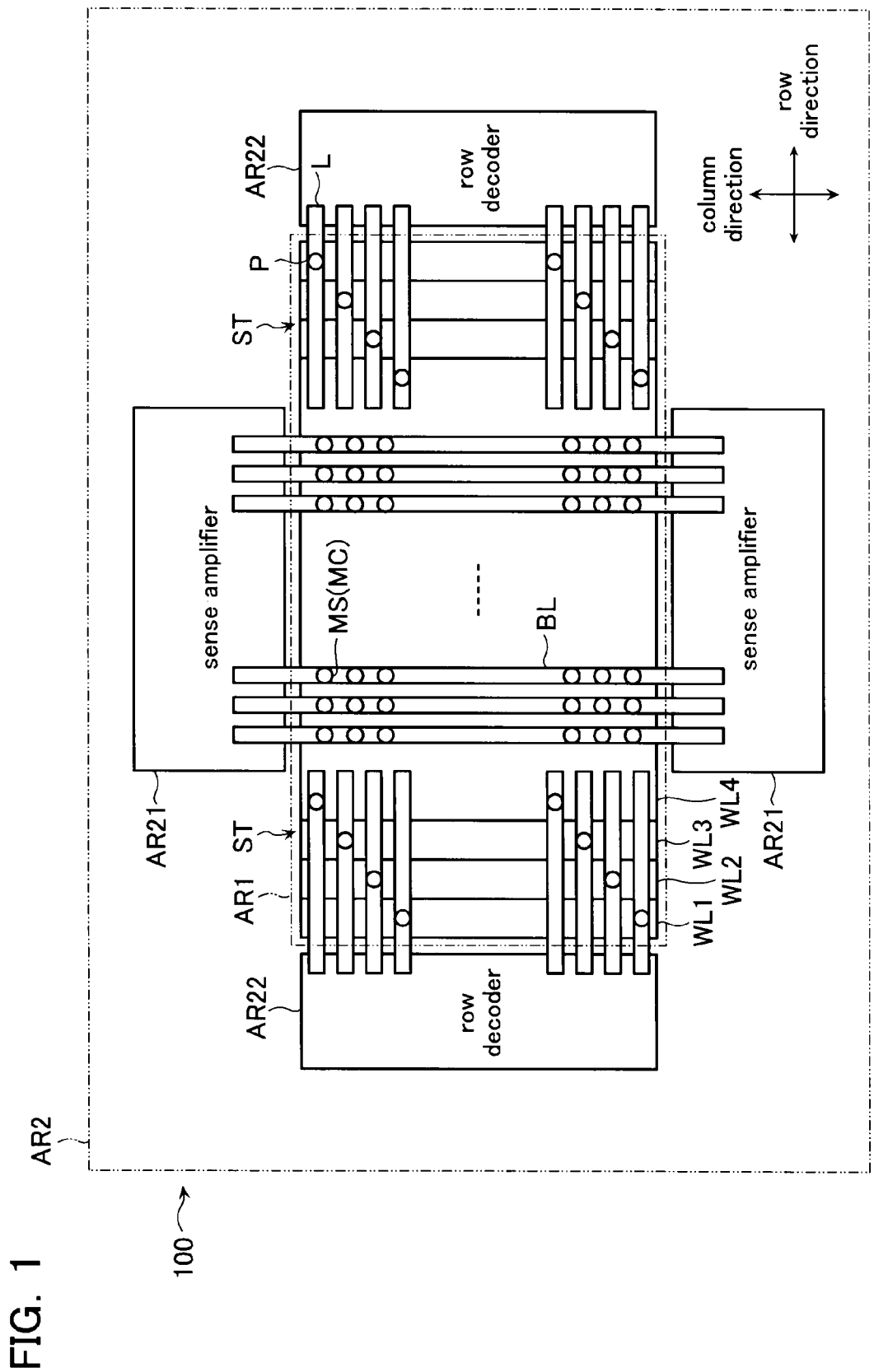
FIG. 1 is a schematic top view of a nonvolatile semiconductor memory device 100 in accordance with a first embodiment.

First, a configuration of a nonvolatile semiconductor memory device 100 in accordance with a first embodiment is described with reference to FIGS. 1-4. FIG. 1 is a schematic top view of the nonvolatile semiconductor memory device 100 in accordance with the first embodiment of the present invention.

As shown in FIG. 1, the nonvolatile semiconductor memory device 100 in accordance with the first embodiment includes a memory region AR1 and a peripheral region AR2 provided in a periphery of the memory region AR1. The memory region AR1 includes a plurality of memory strings MS, each having a plurality of electrically rewritable memory cells MC connected in series. The peripheral region AR2 includes a sense amplifier AR21 and a row decoder AR22 configured to control the memory strings MS, and so on.

As shown in FIG. 1, the memory region AR1 includes plate-like layers constituting word lines WL1-WL4 that extend in a row direction and a column direction. The layers constituting the word lines WL1-WL4 are stacked sequentially from a lower layer and are formed such that a length thereof in the row direction becomes shorter as the layer becomes higher. That is, at end vicinities of the memory region AR1, the layers constituting the word lines WL1-WL4 configure a stepped portion ST formed in a stepped shape such that positions of ends of the layers constituting the word lines WL1-WL4 in the row direction differ from one another.

Further, as shown in FIG. 1, at an end vicinity of the peripheral region AR2 which surrounds the memory region AR1, layers constituting the row decoder AR22 are formed such that positions of ends thereof in the row direction are aligned in a direction substantially perpendicular to a substrate (stacking direction).

Additionally, as shown in FIG. 1, the memory region AR1 and the peripheral region AR2 include a line L, a plug P, and a bit line BL. The line L, the plug P, and the bit line BL are formed so as to straddle the memory region AR1 and the peripheral region AR2. A layer constituting the line L is formed in stripes at an upper portion of the layers constituting the word lines WL1-WL4, the stripes extending in the row direction and having a certain pitch in the column direction. A layer constituting the plug P is formed in the stepped portion ST so as to connect an upper surface of the layers constituting the word lines WL1-WL4 and a lower surface of the layer constituting the line L. A layer constituting the bit line BL is formed so as to connect to an upper surface of a layer constituting the memory strings MS. The layer constituting the bit line BL is formed in stripes, the stripes having a certain pitch in the row direction and extending in the column direction.

Figure 2:
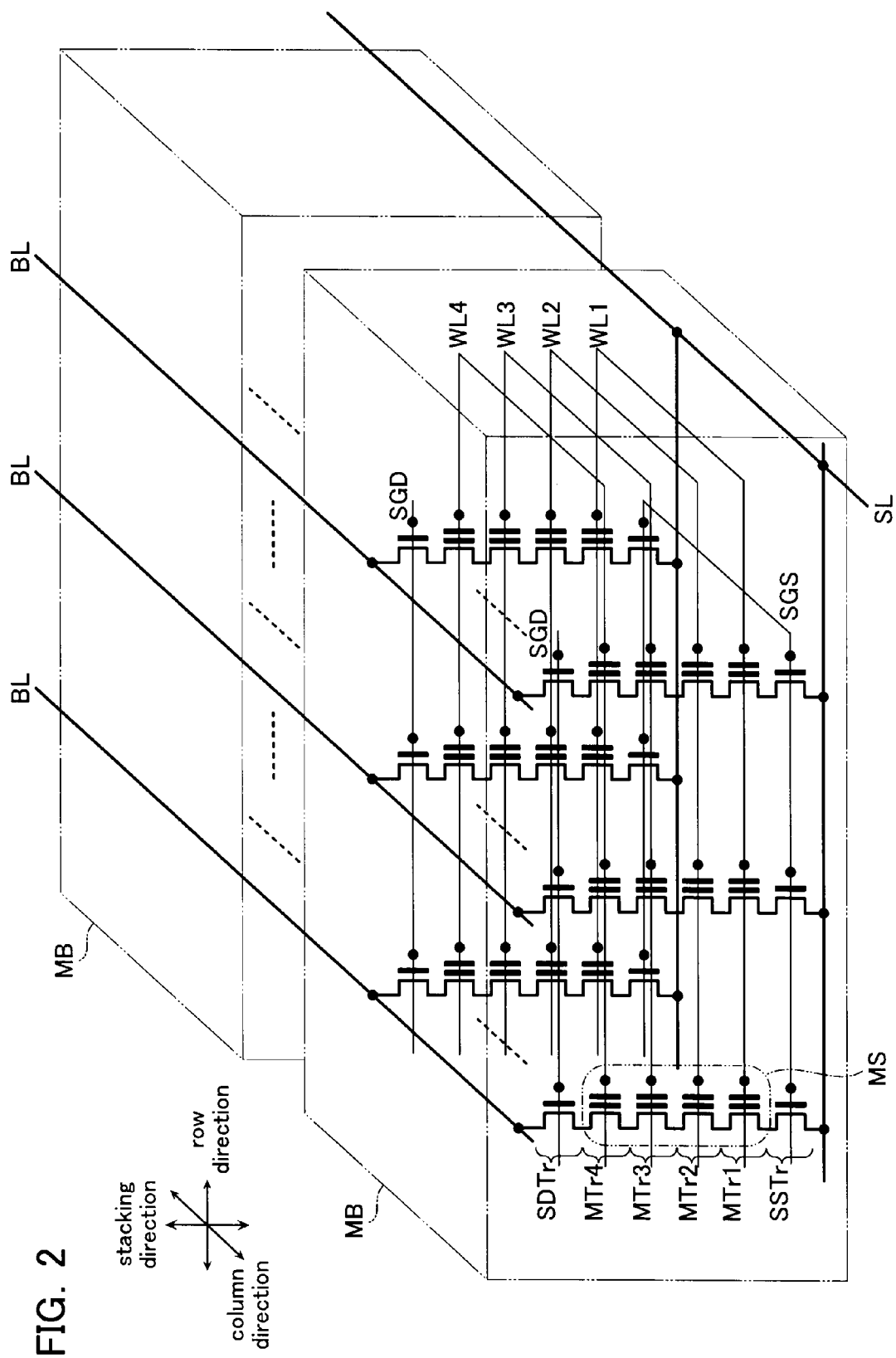
FIG. 2 is a circuit diagram of a memory region AR1 in accordance with the first embodiment.

A circuit configuration of the memory region AR1 is here described. FIG. 2 is a circuit diagram of the memory region AR1. As shown in FIG. 2, the memory region AR1 includes a plurality of memory blocks MB. The memory blocks MB are arranged in the column direction on a semiconductor substrate Ba (not shown). In other words, the memory blocks MB are formed in certain regions on the semiconductor substrate Ba.

As shown in FIG. 2, the memory block MB comprises a plurality of memory strings MS, source side select transistors SSTr, and drain side select transistors SDTr. The memory string MS is configured by memory transistors MTr1-MTr4 connected in series. The drain side select transistor SDTr is connected to one end of the memory string MS (memory transistor MTr4). The source side select transistor SSTr is connected to the other end of the memory string MS (memory transistor MTr1). For example, each individual memory block MB has the memory string MS provided in a matrix formation over a plurality of rows and columns. Note that the memory string MS may be configured by more than four memory transistors.

As shown in FIG. 2, in the memory block MB, a control gate of the memory transistors MTr1 arranged in the matrix formation is commonly connected to the word line WL1. Similarly, a control gate of the memory transistors MTr2 is commonly connected to the word line WL2; a control gate of the memory transistors MTr3 is commonly connected to the word line WL3; and a control gate of the memory transistors MTr4 is commonly connected to the word line WL4.

As shown in FIG. 2, in the memory block MB, a control gate of each of the drain side select transistors SDTr arranged in a line in the row direction is commonly connected to a drain side select gate line SGD. The drain side select gate line SGD is formed so as to extend in the row direction straddling a plurality of memory blocks MB. In one memory block MB, a plurality of drain side select gate lines SGD are provided with a certain pitch in the column direction. In addition, another end of the drain side select transistor SDTr arranged in a line in the column direction is commonly connected to the bit line BL. The bit line BL is formed so as to extend in the column direction straddling the memory block MB. A plurality of bit lines BL is provided in the row direction.

As shown in FIG. 2, a control gate of all the source side select transistors SSTr in one memory block MB is commonly connected to a source side select gate line SGS. In addition, another end of the source side select transistor SSTr arranged in the column direction is commonly connected to a source line SL.

Figure 3:
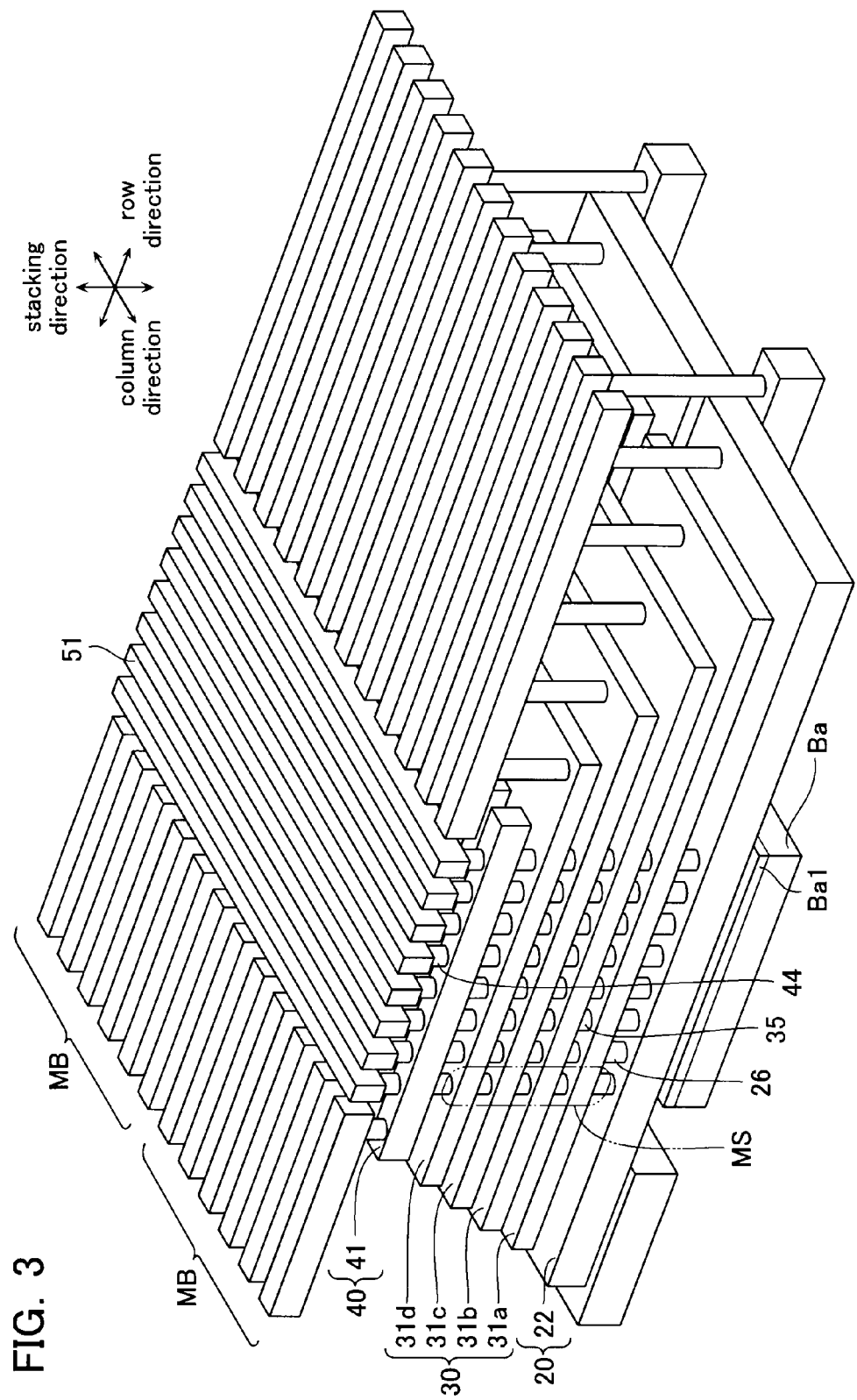
FIG. 3 is a schematic perspective view of the memory region AR1 in accordance with the first embodiment.
Figure 4:
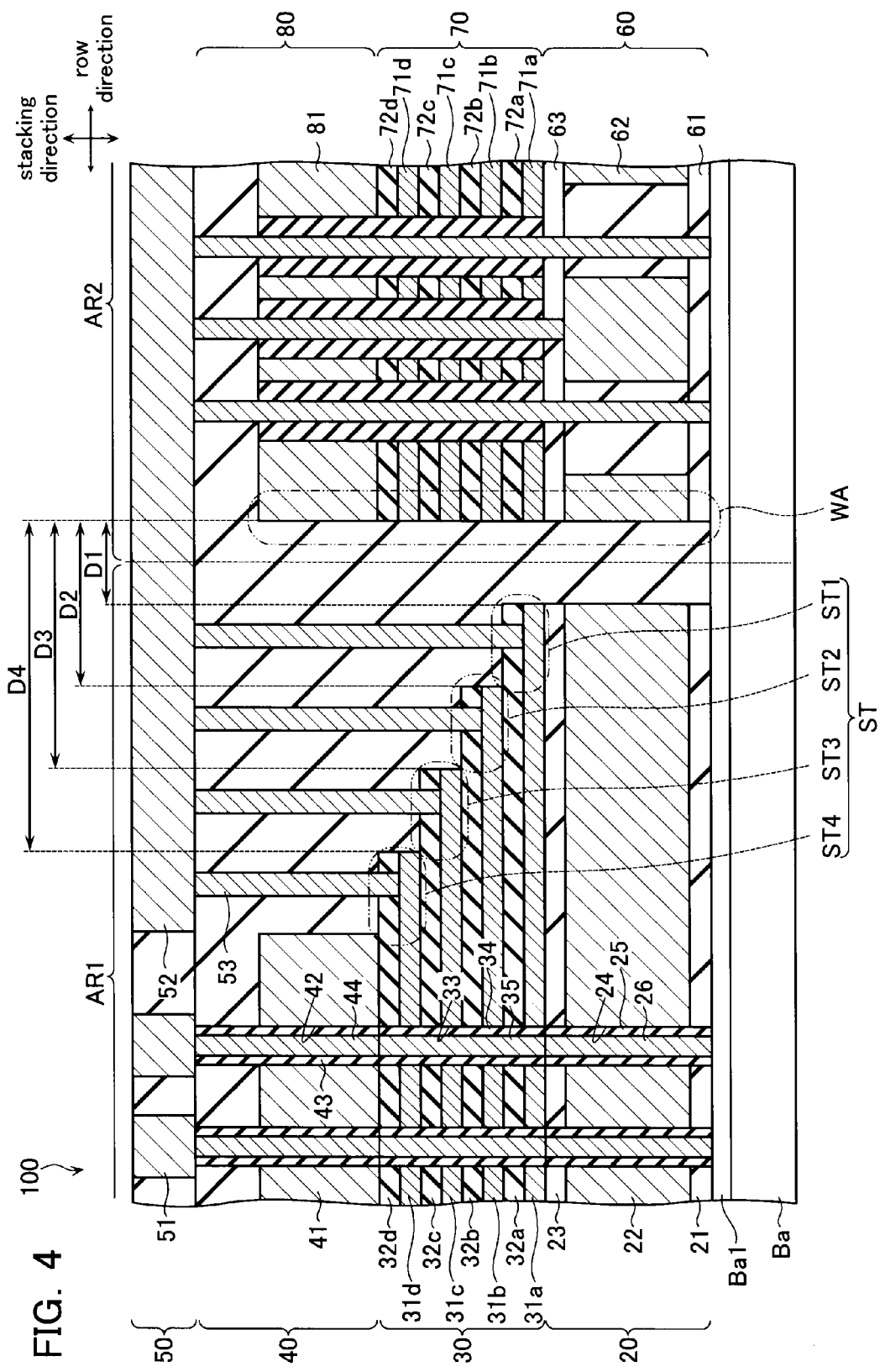
FIG. 4 is a cross-sectional view of the memory region AR1 and a peripheral region AR2 in accordance with the first embodiment.

The above-described circuit configuration of the memory region AR1 is realized by a stacking structure shown in FIGS. 3 and 4. FIG. 3 is a schematic perspective view of the memory region AR1. FIG. 4 is a cross-sectional view of the memory region AR1 and the peripheral region AR2.

The memory region AR1 includes, for each of the memory blocks MB, a source side select transistor layer 20, a memory transistor layer 30, a drain side select transistor layer 40, and a wiring layer 50, stacked sequentially on the semiconductor substrate Ba, as shown in FIGS. 3 and 4.

The source side select transistor layer 20 is a layer which functions as the source side select transistor SSTr. The memory transistor layer 30 is a layer which functions as the memory string MS (memory transistors MTr1-MTr4). The drain side select transistor layer 40 is a layer which functions as the drain side select transistor SDTr. The wiring layer 50 is a layer which functions as various lines extending from the peripheral region AR2.

The source side select transistor layer 20 includes a source side first insulating layer 21, a source side conductive layer 22, and a source side second insulating layer 23, stacked sequentially on the semiconductor substrate Ba, as shown in FIGS. 3 and 4. The source side conductive layer 22 is formed so as to extend two-dimensionally in the row direction and the column direction (in a plate-like shape) along the memory block MB.

The source side first insulating layer 21 and the source side second insulating layer 23 are constituted by, for example, silicon oxide ($SiO_2$) or silicon nitride (SiN). The source side conductive layer 22 is constituted by, for example, polysilicon (p-Si).

Moreover, as shown in FIG. 4, the source side select transistor layer 20 includes a source side hole formed so as to penetrate the source side first insulating layer 21, the source side conductive layer 22, and the source side second insulating layer 23. The source side hole 24 is formed in a matrix in the row direction and the column direction.

Additionally, as shown in FIG. 4, the source side select transistor layer 20 includes a source side gate insulating layer 25 and a source side columnar semiconductor layer 26 formed sequentially on a side wall of the source side hole 24. The source side gate insulating layer 25 is formed with a certain thickness in the side wall of the source side hole 24. The source side columnar semiconductor layer 26 is formed so as to fill the source side hole 24. The source side columnar semiconductor layer 26 is formed in a column shape extending in the stacking direction. An upper surface of the source side columnar semiconductor layer 26 is formed so as to be in contact with a lower surface of a memory columnar semiconductor layer 35 described hereafter. The source side columnar semiconductor layer 26 is formed on a diffusion layer Ba1 on the semiconductor substrate Ba. The diffusion layer Ba1 functions as the source line SL.

The source side gate insulating layer 25 is constituted by, for example, silicon oxide ($SiO_2$). The source side columnar semiconductor layer 26 is constituted by, for example, polysilicon (p-Si).

In the above-described configuration of the source side select transistor layer 20, the source side conductive layer 22 functions as a control gate of the source side select transistor SSTr. In addition, the source side conductive layer 22 functions as the source side select gate line SGS.

The memory transistor layer 30 includes first through fourth word line conductive layers 31a-31d and first through fourth inter-word line insulating layers 32a-32d, stacked sequentially on the source side select transistor layer 20, as shown in FIGS. 3 and 4. The first through fourth word line conductive layers 31a-31d and the first through fourth inter-word line insulating layers 32a-32d are formed so as to extend two-dimensionally in the row direction and the column direction (in a plate-like shape). The first through fourth word line conductive layers 31a-31d and the first through fourth inter-word line insulating layers 32a-32d are divided into memory cell blocks.

Figure 5:
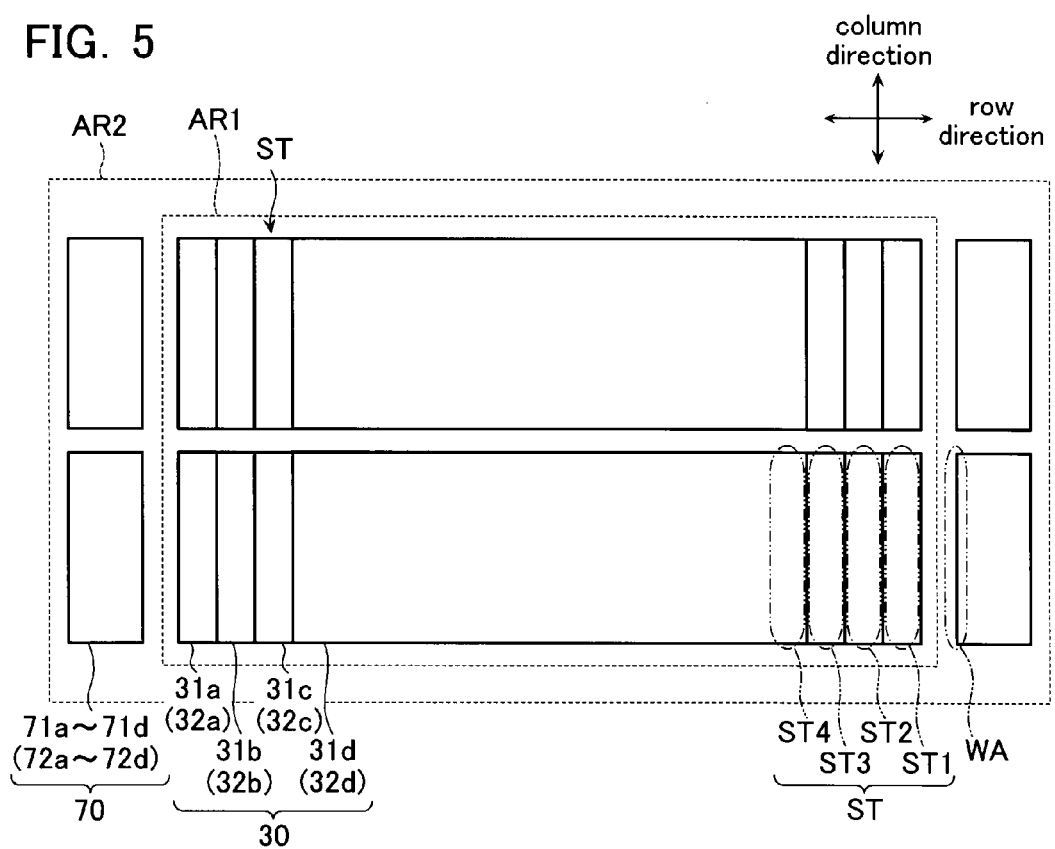
FIG. 5 is a top view showing a memory transistor layer 30 and a first dummy layer 70 in accordance with the first embodiment.

The first through fourth word line conductive layers 31a-31d are configured here as shown in FIGS. 3-5. FIG. 5 is a top view showing the memory transistor layer 30 and a first dummy layer 70 described hereafter in accordance with the first embodiment. At the end vicinities of the memory region AR1, the first through fourth word line conductive layers 31a-31d and the first through fourth inter-word line insulating layers 32a-32d are formed in a stepped shape such that positions of ends thereof in the row direction differ from one another. That is, the ends in the row direction of the first through fourth word line conductive layers 31a-31d and the first through fourth inter-word line insulating layers 32a-32d configure a stepped portion ST formed in a stepped shape. The stepped portion ST is formed so as to extend in the row direction towards the peripheral region AR2. The stepped portion ST includes steps ST1-ST4 arranged in a line in the row direction.

The steps ST1-ST4 are provided adjacently in the row direction from the end vicinities of the memory region AR1 towards the center of the memory region AR1, as shown in FIGS. 4 and 5. The step ST1 is positioned lowest in the stepped portion ST; the step ST2 is provided above the step ST1; the step ST3 is provided above the step ST2; and the step ST4 is provided above the step ST3.

The steps ST1-ST4 are each configured by a stacked structure of one conductive layer and one insulating layer, as shown in FIG. 4. That is, the step ST1 is configured by an end of the first word line conductive layer 31a and an end of the first inter-word line insulating layer 32a; the step ST2 is configured by an end of the second word line conductive layer 31b and an end of the second inter-word line insulating layer 32b; the step ST3 is configured by an end of the third word line conductive layer 31c and an end of the third inter-word line insulating layer 32c; and the step ST4 is configured by an end of the fourth word line conductive layer 31d and an end of the fourth inter-word line insulating layer 32d. In the steps ST1-ST4, the first through fourth inter-word line insulating layers 32a-32d have an interlayer insulating layer formed on an upper surface thereof.

In the step ST1, the end of the first word line conductive layer 31a (first inter-word line insulating layer 32a) is formed with a distance D1 in the row direction from an end of a conductive layer 71a described hereafter, as shown in FIG. 4.

In the step ST2, the end of the second word line conductive layer 31b (second inter-word line insulating layer 32b) is formed with a distance D2 (D2>D1) in the row direction from an end of a conductive layer 71b described hereafter. In the step ST3, the end of the third word line conductive layer 31c (third inter-word line insulating layer 32c) is formed with a distance D3 (D3>D2) in the row direction from an end of a conductive layer 71c described hereafter. And in the step ST4, the end of the fourth word line conductive layer 31d (fourth inter-word line insulating layer 32d) is formed with a distance D4 (D4>D3) in the row direction from an end of a conductive layer 71d described hereafter.

The first through fourth word line conductive layers 31a-31d are constituted by, for example, polysilicon (p-Si). The first through fourth inter-word line insulating layers 32a-32d are constituted by, for example, silicon oxide ($SiO_2$).

Moreover, as shown in FIG. 4, the memory transistor layer 30 includes a memory hole 33 formed so as to penetrate the first through fourth word line conductive layers 31a-31d and the first through fourth inter-word line insulating layers 32a-32d. The memory hole 33 is formed in a matrix in the row direction and the column direction. The memory hole 33 is formed at a position aligning with the source side hole 25.

Figure 6:
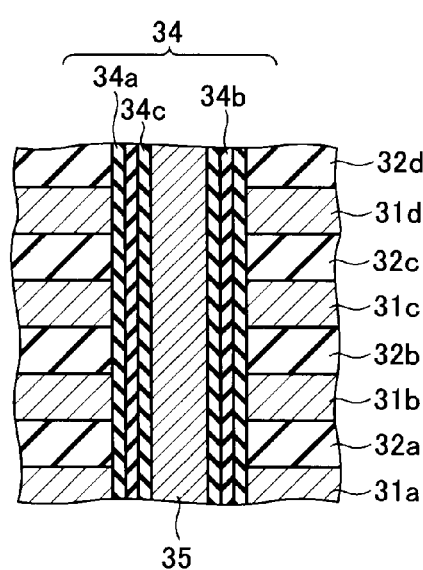
FIG. 6 is an enlarged view of FIG. 4.

Additionally, as shown in FIGS. 4 and 6, the memory transistor layer 30 includes a block insulating layer 34a, a charge storage layer 34b, a tunnel insulating layer 34c, and the memory columnar semiconductor layer 35, stacked sequentially on a side wall of the memory hole 33.

The block insulating layer 34a is formed with a certain thickness on the side wall of the memory hole 33, as shown in FIG. 6. The charge storage layer 34b is formed with a certain thickness on a side wall of the block insulating layer 34a. The tunnel insulating layer 34c is formed with a certain thickness on a side wall of the charge storage layer 34b. The memory columnar semiconductor layer 35 is formed so as to fill the memory hole 33. The memory columnar semiconductor layer 35 is formed in a column shape extending in the stacking direction. The lower surface of the memory columnar semiconductor layer 35 is formed so as to be in contact with the upper surface of the source side columnar semiconductor layer 26. Moreover, an upper surface of the memory columnar semiconductor layer 35 is formed so as to be in contact with a lower surface of a drain side columnar semiconductor layer 44 described hereafter.

The block insulating layer 34a and the tunnel insulating layer 34c are constituted by, for example, silicon oxide ($SiO_2$). The charge storage layer 34b is constituted by, for example, silicon nitride (SiN). The memory columnar semiconductor layer 35 is constituted by, for example, polysilicon (p-Si).

In the above-described configuration of the memory transistor layer 30, the first through fourth word line conductive layers 31a-31d function as a control gate of the memory transistors MTr1-MTr4. In addition, the first through fourth word line conductive layers 31a-31d function as a part of the word lines WL1-WL4.

The drain side select transistor layer 40 includes a drain side conductive layer 41 stacked on the memory transistor layer 30, as shown in FIGS. 3 and 4. The drain side conductive layer 41 is formed directly above where the memory columnar semiconductor layer 35 is formed. The drain side conductive layer 41 is formed in stripes extending in the row direction and having a certain pitch in the column direction.

The drain side conductive layer 41 is constituted by, for example, polysilicon (p-Si).

Moreover, as shown in FIG. 4, the drain side select transistor layer 40 includes a drain side hole 42 formed so as to penetrate the drain side conductive layer 41. The drain side hole 42 is formed in a matrix in the row direction and the column direction. The drain side hole 42 is formed at a position aligning with the memory hole 33.

Additionally, as shown in FIG. 4, the drain side select transistor layer 40 includes a drain side gate insulating layer 43 and a drain side columnar semiconductor layer 44 formed sequentially on a side wall of the drain side hole 42. The drain side gate insulating layer 43 is formed with a certain thickness on the side wall of the drain side hole 42. The drain side columnar semiconductor layer 44 is formed so as to fill the drain side hole 42. The drain side columnar semiconductor layer 44 is formed in a column shape extending in the stacking direction. The lower surface of the drain side columnar semiconductor layer 44 is formed so as to be in contact with the upper surface of the memory columnar semiconductor layer 35.

The drain side gate insulating layer 43 is constituted by, for example, silicon oxide ($SiO_2$). The drain side columnar semiconductor layer 44 is constituted by, for example, polysilicon (p-Si).

In the above-described configuration of the drain side select transistor layer 40, the drain side conductive layer 41 functions as a control gate of the drain side select transistor SDTr. In addition, the drain side conductive layer 41 functions as a part of the drain side select gate line SGD.

The wiring layer 50 includes a first wiring layer 51, a second wiring layer 52, and a contact plug layer 53, as shown in FIGS. 3 and 4. The first wiring layer 51 and the second wiring layer 52 are provided on an upper layer of the drain side select transistor layer 40. The first wiring layer 51 is formed so as to be in contact with an upper surface of the drain side columnar semiconductor layer 44. The first wiring layer 51 is formed so as to extend in the column direction with a certain pitch in the row direction. The first wiring layer 51 functions as the bit line BL. The second wiring layer 52 is formed so as to extend in the row direction with a certain pitch in the column direction. The contact plug layer 53 is formed so as to connect a lower surface of the second wiring layer 52 and an upper surface of the respective first through fourth word line conductive layers 31a-31d.

The first wiring layer 51, the second wiring layer 52, and the contact plug layer 53 are constituted by, for example, tungsten (W).

The peripheral region AR2 includes a peripheral wiring layer 60, the first dummy layer 70, a second dummy layer 80, and the wiring layer 50, as shown in FIGS. 1 and 4. The peripheral wiring layer 60 is formed in the same layer as the source side select transistor layer 20. The first dummy layer 70 is formed in the same layer as the memory transistor layer 30. The second dummy layer 80 is formed in the same layer as the drain side select transistor layer 40. As described later, the peripheral wiring layer 60, the first dummy layer 70, and the second dummy layer 80 share the same layers with the source side select transistor layer 20, the memory transistor layer 30, and the drain side select transistor layer 40 during the manufacturing process. The peripheral wiring layer 60, the first dummy layer 70, and the second dummy layer 80 are formed by dividing them from the source side select transistor layer 20, the memory transistor layer 30, and the drain side select transistor layer 40 using etching. Note that the wiring layer 50 has a common configuration in the memory region AR1 and the peripheral region AR2.

The peripheral wiring layer 60 is for forming transistors and other lines configuring the row decoder AR22.

The peripheral wiring layer 60 includes a first insulating layer 61, a conductive layer 62, and a second insulating layer 63, formed sequentially on the semiconductor substrate Ba. The first insulating layer 61 is formed in the same layer as the source side first insulating layer 21. The conductive layer 62 is formed in the same layer as the source side conductive layer 22. The second insulating layer 63 is formed in the same layer as the source side second insulating layer 23.

The first insulating layer 61 and the second insulating layer 63 are constituted by, for example, silicon oxide ($SiO_2$). The conductive layer 62 is constituted by, for example, polysilicon (p-Si).

The conductive layer 62 functions as transistors and other lines configuring the row decoder AR22.

The first dummy layer 70 includes conductive layers 71a-71d and insulating layers 72a-72d stacked sequentially on the peripheral wiring layer 60, as shown in FIG. 4. The conductive layers 71a-71d are formed in the same layer as the first through fourth word line conductive layers 31a-31d. The insulating layers 72a-72d are formed in the same layer as the first through fourth inter-word line insulating layers 32a-32d. The conductive layers 71a-71d themselves are not used as lines. The conductive layers 71a-71d are provided with an interlayer insulating layer that fills a through-hole configured to penetrate the conductive layers 71a-71d; and a contact plug configured to penetrate the interlayer insulating layer. That is, the conductive layers 71a-71d are used as layers for forming therein a contact plug connected to a transistor of a peripheral circuit.

At an end vicinity of the peripheral region AR2 which surrounds the memory region AR1, the conductive layers 71a-71d and the insulating layers 72a-72d are formed such that positions of ends thereof in the row direction are aligned in a direction substantially perpendicular to the semiconductor substrate Ba. That is, the ends of the conductive layers 71a-71d and the insulating layers 72a-72d in the row direction configure a wall portion WA which is a wall surface substantially perpendicular to the semiconductor substrate Ba. Here, "substantially perpendicular" is used only with a meaning that there are not a plurality of contact plugs formed penetrating the wall portion WA. For example, "a direction substantially perpendicular" is assumed to be one at an angle of 85°-91° to the semiconductor substrate Ba, but this is not rigorous. Moreover, in the same way, a meaning of "align" includes a certain amount of unevenness. As is clear from the above, the conductive layers 71a-71d differ from the first through fourth word line conductive layers 31a-31d configuring the stepped portion ST in that the end of the conductive layers 71a-71d configures the wall portion WA.

The conductive layers 71a-71d are constituted by, for example, polysilicon (p-Si). The insulating layers 72a-72d are constituted by, for example, silicon oxide ($SiO_2$).

The second dummy layer 80 includes a conductive layer 81 stacked on the first dummy layer 70, as shown in FIG. 4. The conductive layer 81 is formed in the same layer as the drain side conductive layer 41. The conductive layer 81 is constituted by, for example, polysilicon (p-Si).

(Method of Manufacturing the Nonvolatile Semiconductor Memory Device 100 in Accordance with the First Embodiment)

Next, a method of manufacturing the nonvolatile semiconductor memory device 100 in accordance with the first embodiment is described with reference to FIGS. 7-15. FIGS. 7-15 are cross-sectional views showing a manufacturing process of the nonvolatile semiconductor memory device 100 in accordance with the first embodiment. Note that processes shown below show the processes subsequent to forming the source side select transistor layer 20 (peripheral wiring layer 60).

Figure 7:
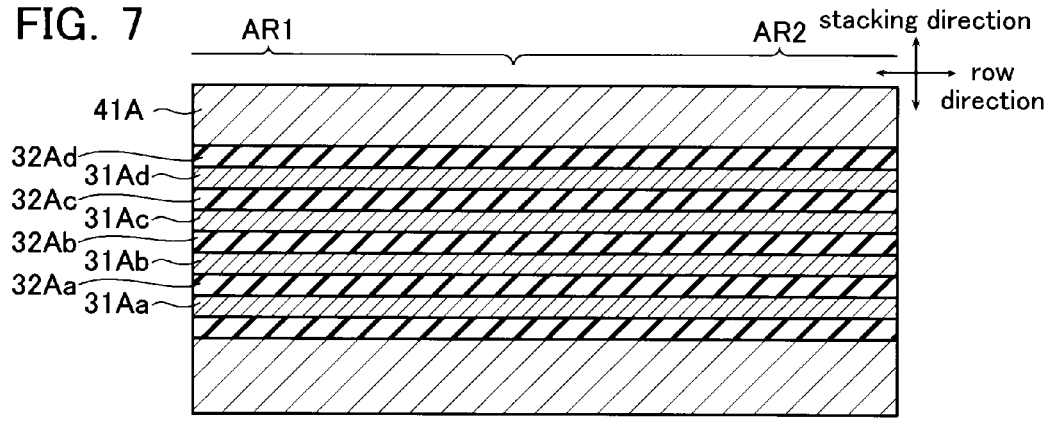
FIGS. 7-15 are cross-sectional views showing a manufacturing process of the nonvolatile semiconductor memory device 100 in accordance with the first embodiment.

First, polysilicon (p-Si) and silicon oxide ($SiO_2$) are alternately deposited on an upper layer of the source side select transistor layer 20 (peripheral wiring layer 60) to form layers 31Aa-31Ad, layers 32Aa-32Ad, and a layer 41A, as shown in FIG. 7.

Figure 8:
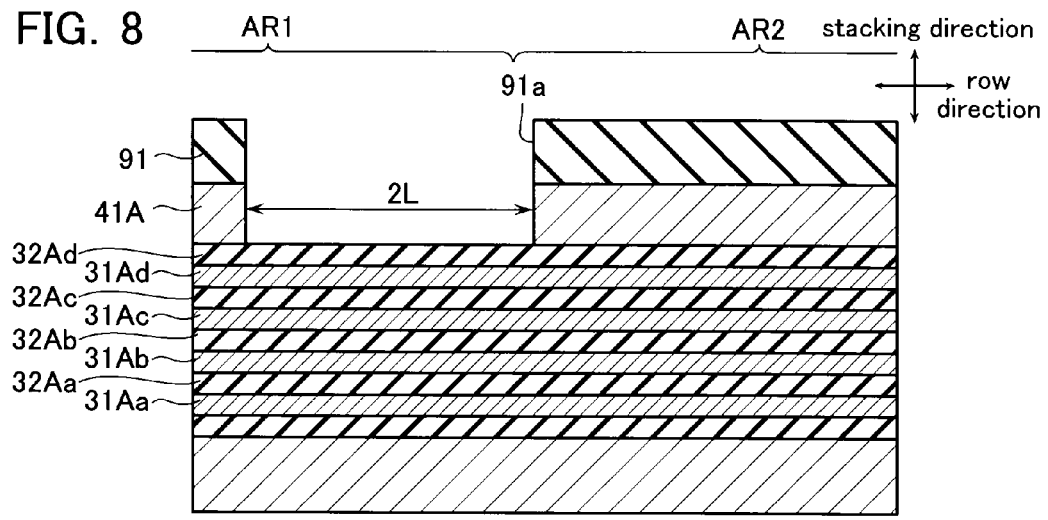

Then, a mask layer 91 is formed in a certain pattern on the layer 41A, as shown in FIG. 8. The mask layer 91 has a width 2L in the row direction, and includes a trench 91a extending in the column direction. The trench 91a is formed from the end vicinity in the row direction of the memory region AR1 as far as the peripheral region AR2. The trench 91a is formed so as to penetrate the mask layer 91. The mask layer 91 is then used as a mask to etch the layer 41A in the certain pattern.

Figure 9:
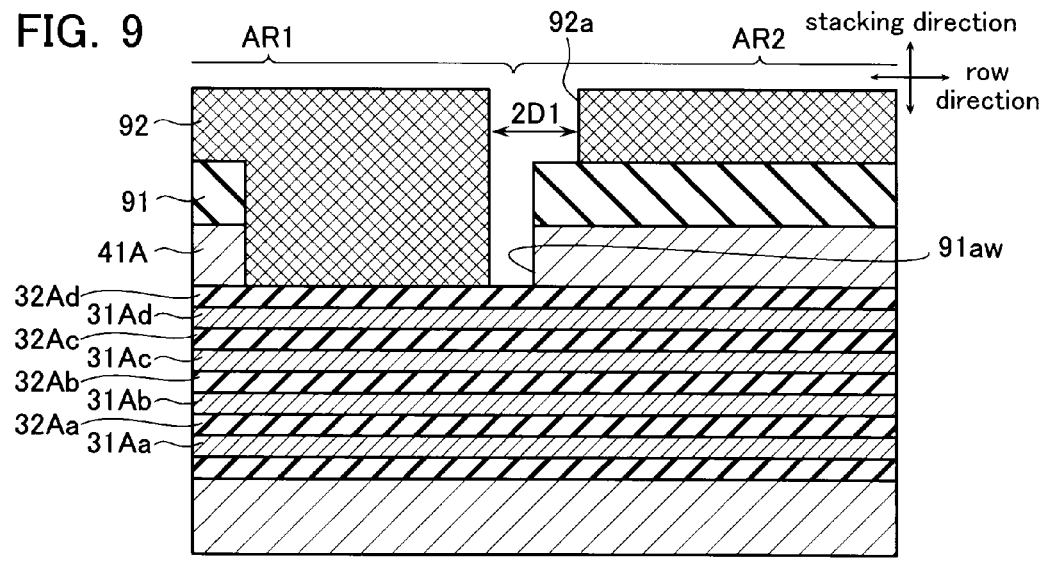

Next, a resist layer 92 is formed so as to cover the mask layer 91, as shown in FIG. 9. Here, the resist layer 92 is patterned so as to include a trench 92a extending in the column direction and having a width in the row direction of length 2D1 (D1<L), the trench 92a being centered on a side wall of the layer 41A on the peripheral region AR2 side (in other words, being centered on a side wall 91aw of the trench 91a on the peripheral region AR2 side). The trench 92a is formed so as to penetrate the resist layer 92.

Figure 10:
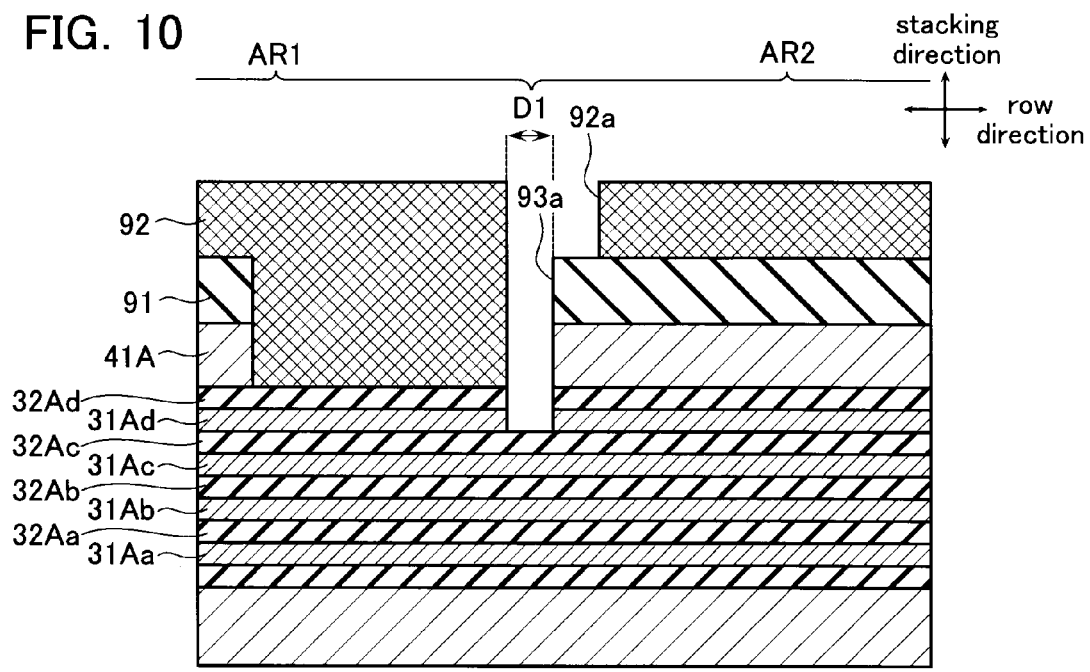

Subsequently, etching is performed using the mask layer 91 and the resist layer 92 as a mask, thereby forming a trench 93a configured to penetrate the layers 31Ad and 32Ad, as shown in FIG. 10. The trench 93a is formed having as an end thereof the side wall of the layer 41A on the peripheral region AR2 side. The trench 93a has a width D1 in the row direction.

Figure 11:
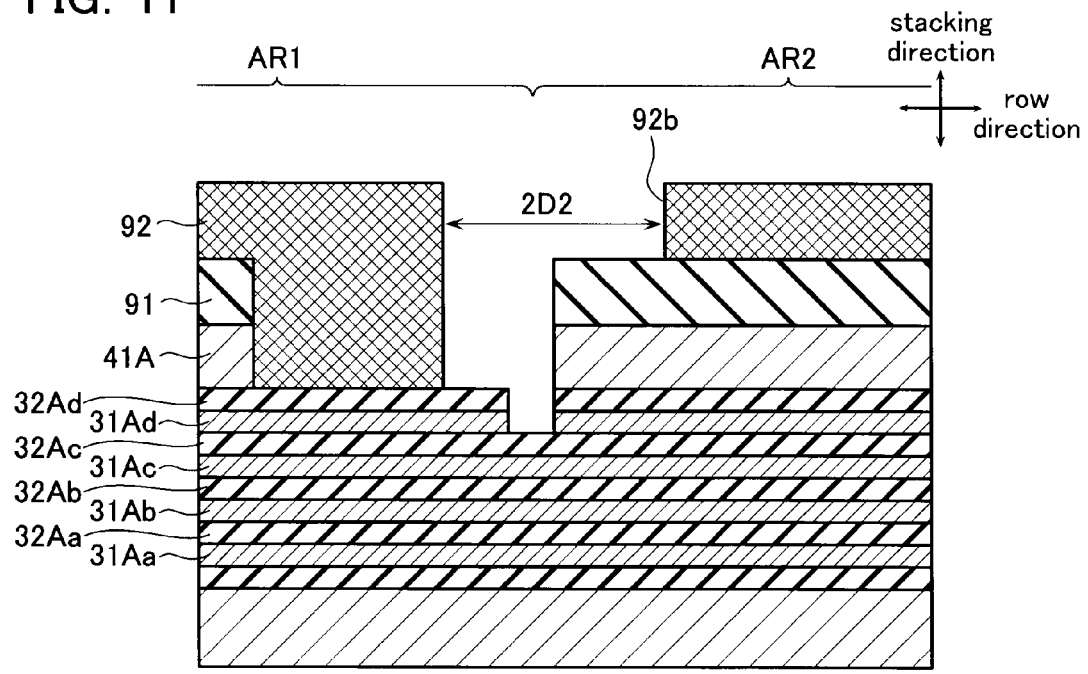

Next, slimming of the resist layer 92 in the row direction is performed, as shown in FIG. 11. Through this process, the resist layer 92 includes a trench 92b having a spacing 2D2 (D1<D2<L) in the row direction, the trench 92b being centered on the side wall of the layer 41A on the peripheral region AR2 side.

Figure 12:
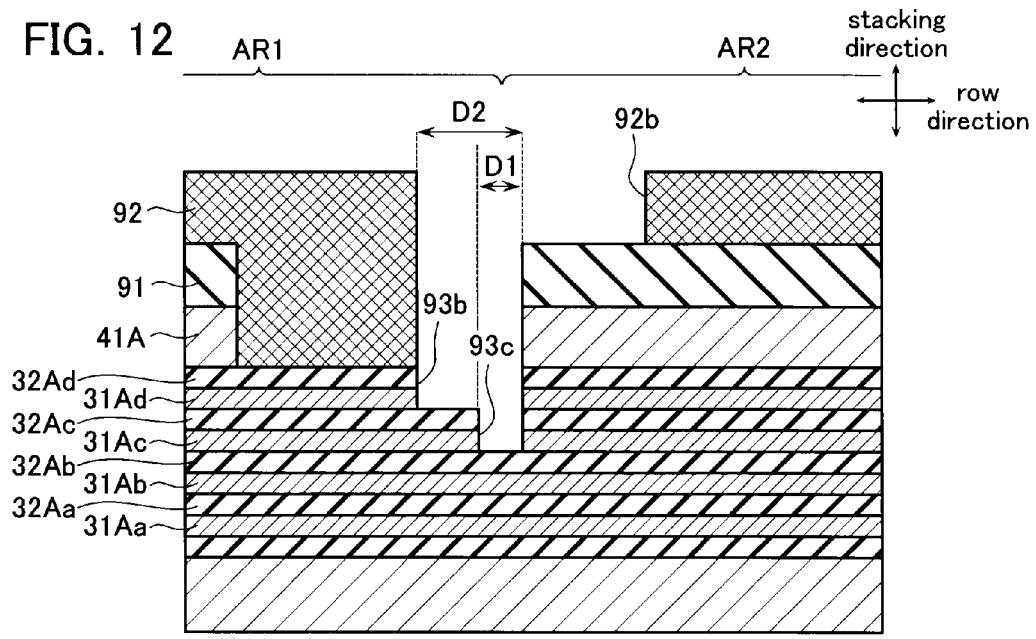

Then, etching is performed using the mask layer 91 and the resist layer 92 as a mask, thereby forming a trench 93b configured to penetrate the layers 31Ad and 32Ad and a trench 93c configured to penetrate the layers 31Ac and 32Ac, as shown in FIG. 12. The trenches 93b and 93c are formed having as an end thereof the side wall of the layer 41A on the peripheral region AR2 side. The trench 93b has a width D2-D1 in the row direction, and the trench 93c has a width D1 in the row direction.

Figure 13:
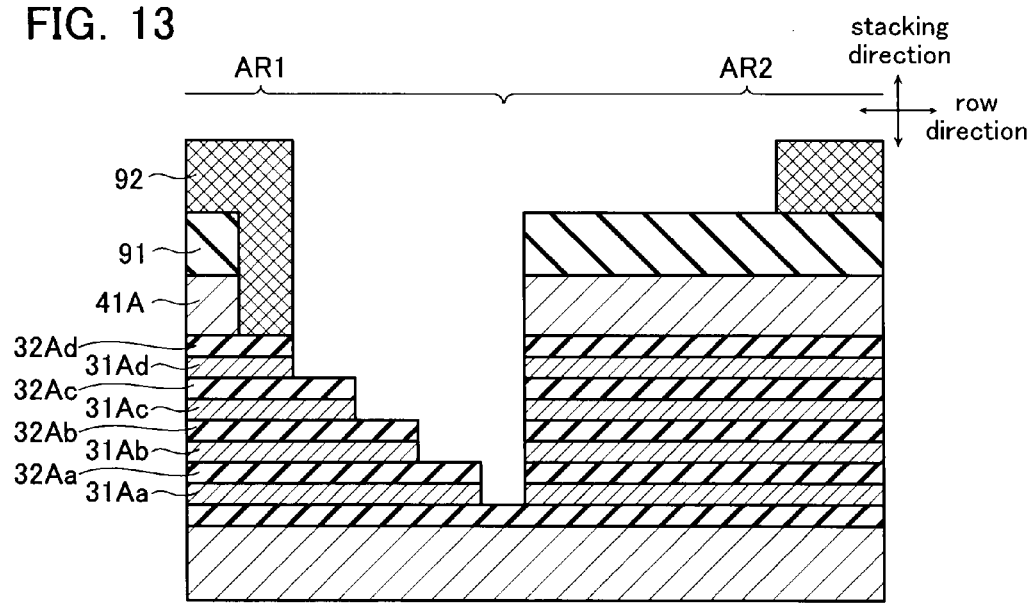

Next, as shown in FIG. 13, the slimming of the resist layer 92 in the row direction and the etching shown in FIGS. 11 and 12 are repeatedly performed, whereby the layers 31Aa-31Ad become the first through fourth word line conductive layers 31a-31d and the conductive layers 71a-71d; and the layers 32Aa-32Ad become the first through fourth inter-word line insulating layers 32a-32d and the insulating layers 72a-72d.

Figure 14:
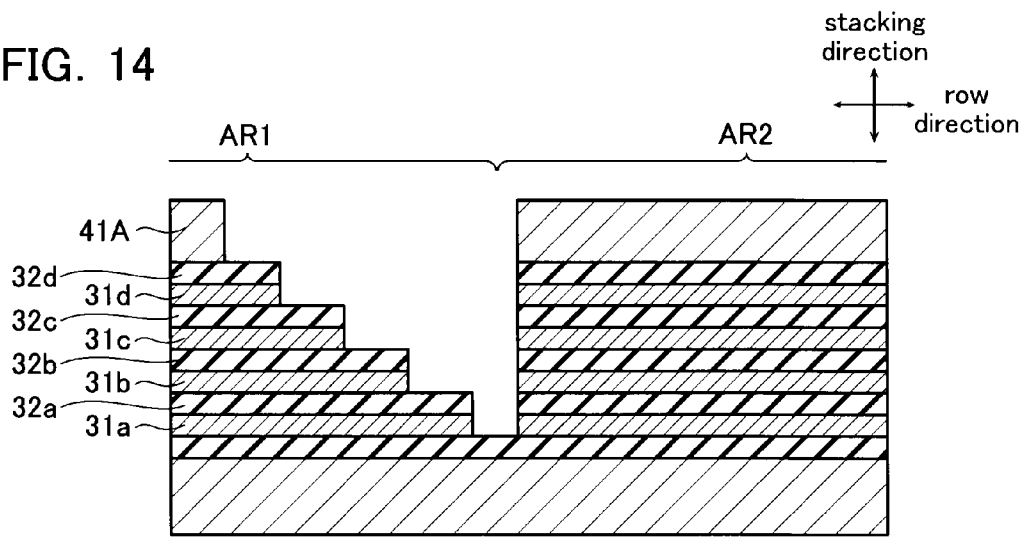

Subsequently, the resist layer 92 and the mask layer 91 are removed, as shown in FIG. 14.

Figure 15:
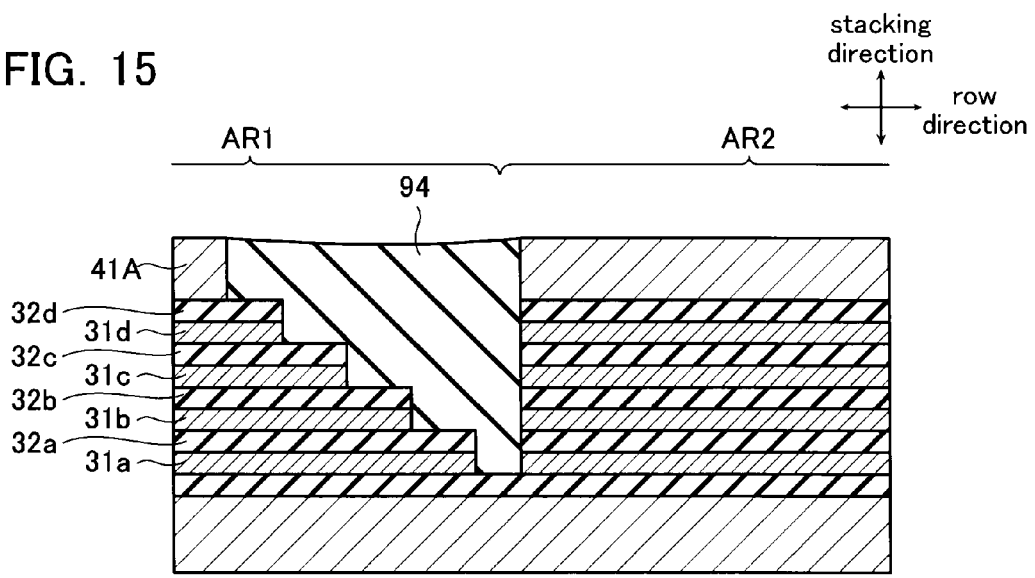

Next, silicon oxide ($SiO_2$) is deposited as far as an upper surface of the layer 41A to form an interlayer insulating layer 94, as shown in FIG. 15.

Then, subsequent to the process shown in FIG. 15, the wiring layer 50 is formed, thereby completing manufacture of the nonvolatile semiconductor memory device 100 shown in FIG. 4.

(Advantages of the Nonvolatile Semiconductor Memory Device 100 in Accordance with the First Embodiment)

Next, advantages of the nonvolatile semiconductor memory device 100 in accordance with the first embodiment are described. The nonvolatile semiconductor memory device 100 in accordance with the first embodiment is capable of a high degree of integration as shown in the above-described stacking structure.

Figure 16A:
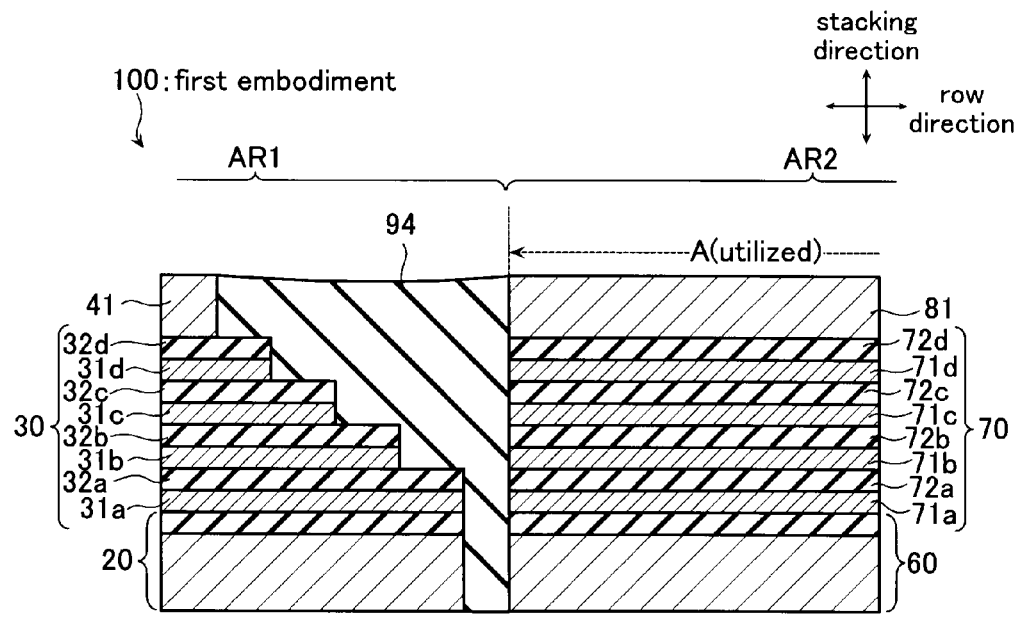
FIGS. 16A, 16B are views comparing a nonvolatile semiconductor memory device 200 in accordance with a comparative example and the nonvolatile semiconductor memory device 100 in accordance with the first embodiment.
Figure 16A:
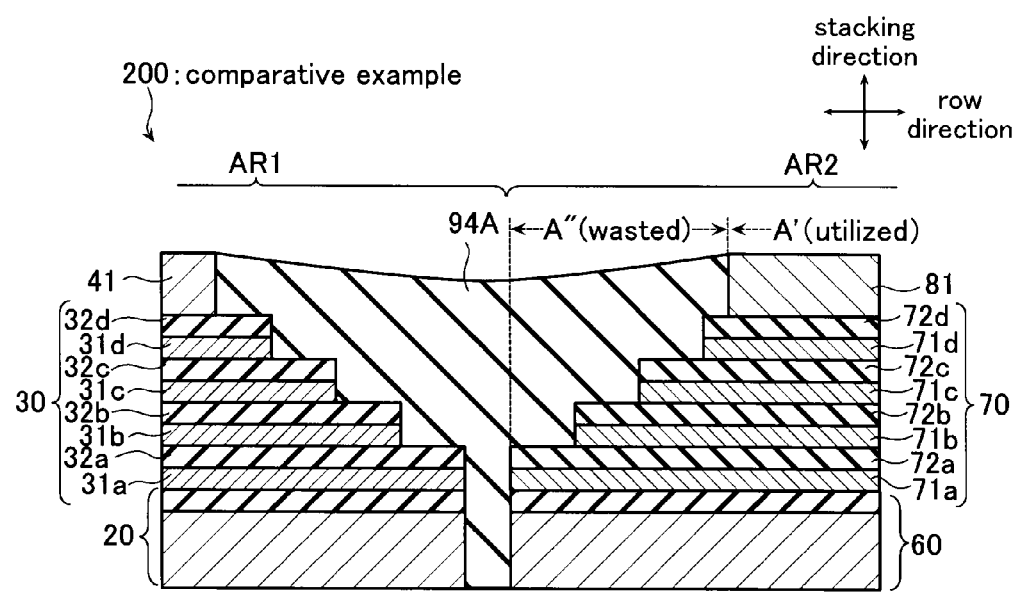
Figure 16B:
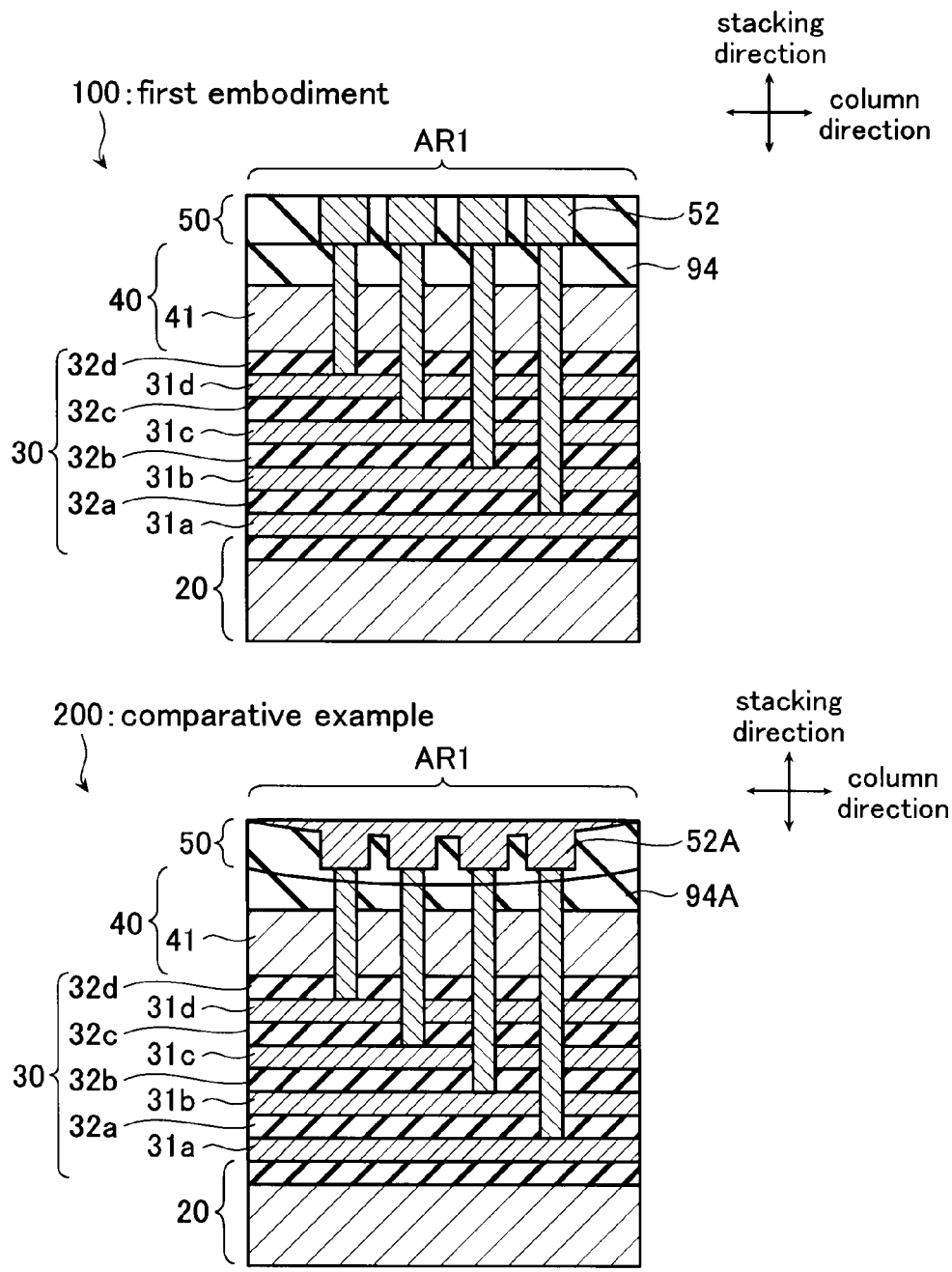

Here, a nonvolatile semiconductor memory device 200 in accordance with a comparative example and the nonvolatile semiconductor memory device 100 in accordance with the first embodiment are compared while referring to FIGS. 16A and 16B. The nonvolatile semiconductor memory device 200 in accordance with the comparative example includes a first dummy layer 70A which differs from that of the first embodiment. The first dummy layer 70A includes conductive layers 71Aa-71Ad and insulating layers 72Aa-72Ad which differ from those of the first embodiment. An end of the conductive layers 71Aa-71Ad and the insulating layers 72Aa-72Ad is formed in a stepped shape. Now, in the first dummy layer 70A, a non-stepped shape region A' can be used as a region for forming contact plugs that connect to the lower-lying peripheral wiring layer 60. However, an end region A" formed in the stepped shape constitutes a wasted region where contact plugs and the like cannot be formed. This region A" causes an occupied area of the nonvolatile semiconductor memory device to increase, and hinders miniaturization.

In contrast, in the nonvolatile semiconductor memory device 100 in accordance with the first embodiment, at the end vicinity of the peripheral region AR2 which surrounds the memory region AR1, the conductive layers 71a-71d are formed such that a positions of ends thereof are aligned in a direction substantially perpendicular to the semiconductor substrate Ba, thereby configuring the wall portion WA. That is, the end of the conductive layers 71a-71d is not configured in a stepped shape like the comparative example. Consequently, as shown in FIG. 16A, a region A in the first dummy layer 70 in accordance with the first embodiment is larger than the region A' of the comparative example, and can be effectively utilized in its entirety as a region for forming contact plugs. As a result, an occupied area of the nonvolatile semiconductor memory device 100 in accordance with the first embodiment can be reduced more than in the comparative example 200.

In addition, the interlayer insulating layer 94 in accordance with the first embodiment 100 is formed shorter in the row direction than an interlayer insulating layer 94A of the comparative example 200, as shown in FIG. 16A. As a result, dishing in an upper surface of the interlayer insulating layer 94 can be made smaller than in the interlayer insulating layer 94A.

As shown here in FIG. 16B, when forming a second wiring layer 52A on an upper layer of the interlayer insulating layer 94A in the comparative example 200, there is a risk that, due to the influence of the above-described dishing, even with execution of CMP or the like, metal remains between the second wiring layers 52A or the like thereby causing a short circuit.

In contrast, as shown in FIG. 16B, when forming the second wiring layer 52 on an upper layer of the interlayer insulating layer 94 in the first embodiment, since there is no dishing of the kind in the comparative example 200, the second wiring layer 52 has a neater shape than in the comparative example 200. That is, in the nonvolatile semiconductor memory device 100 in accordance with the first embodiment, the risk of a short circuit occurring in the second wiring layer 52 can be suppressed over the comparative example 200.

[Second Embodiment]
(Configuration of a Nonvolatile Semiconductor Memory Device in Accordance with a Second Embodiment)

Figure 17:
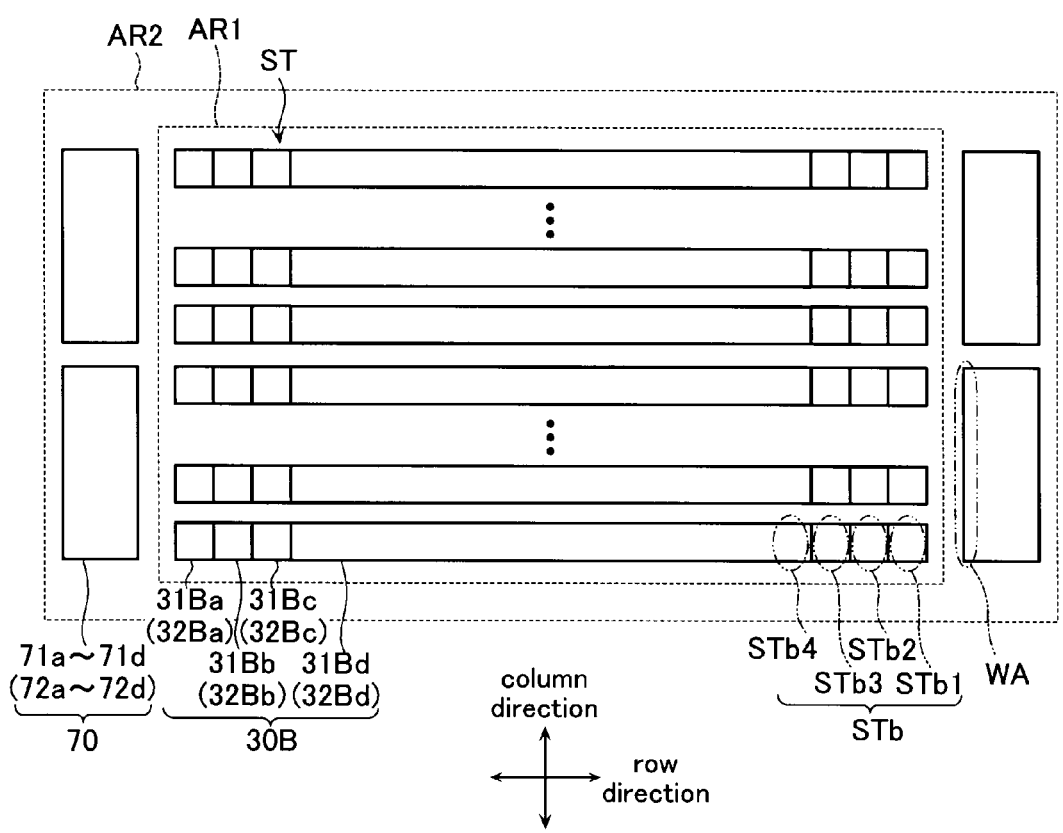
FIG. 17 is a top view showing a memory transistor layer 30B and the first dummy layer 70 in accordance with a second embodiment.

Next, a configuration of a nonvolatile semiconductor memory device in accordance with a second embodiment is described with reference to FIG. 17. The nonvolatile semiconductor memory device in accordance with the second embodiment has an overall configuration which is similar to that of the first embodiment (FIGS. 1-4); however, a configuration of a memory transistor layer 30B differs from that of the first embodiment. FIG. 17 is a top view showing the memory transistor layer 30B and the first dummy layer 70 in accordance with the second embodiment. Note that in the second embodiment, identical symbols are assigned to configurations similar to those in the first embodiment and descriptions thereof are omitted.

The memory transistor layer 30B includes first through fourth word line conductive layers 31Ba-31Bd and first through fourth inter-word line insulating layers 32Ba-32Bd, as shown in FIG. 17. The first through fourth word line conductive layers 31Ba-31Bd and the first through fourth inter-word line insulating layers 32Ba-32Bd are formed in stripes extending in the row direction and having a certain pitch in the column direction, for each memory block MB. The second embodiment differs in this point from the first embodiment which has the first through fourth word line conductive layers 31a-31d and the first through fourth inter-word line insulating layers 32a-32d formed so as to extend two-dimensionally in the row direction and the column direction (in a plate-like shape). Each of the first through fourth word line conductive layers 31Ba-31Bd and the first through fourth inter-word line insulating layers 32Ba-32Bd is formed so as to surround one line of the memory columnar semiconductor layers 35 arranged in the row direction.

Moreover, the first through fourth word line conductive layers 31Ba-31Bd and the first through fourth inter-word line insulating layers 32Ba-32Bd have an end thereof in the row direction formed in a stepped shape, thereby configuring a stepped portion STb, similarly to the first embodiment. The stepped portion STb includes steps STb1-STb4 lined up in the row direction.

(Advantages of the Nonvolatile Semiconductor Memory Device in Accordance with the Second Embodiment)

The nonvolatile semiconductor memory device in accordance with the second embodiment includes the stepped portion STb and the wall portion WA, and displays similar advantages to the first embodiment.

[Third Embodiment]
(Configuration of a Nonvolatile Semiconductor Memory Device in Accordance with a Third Embodiment)

Figure 18:
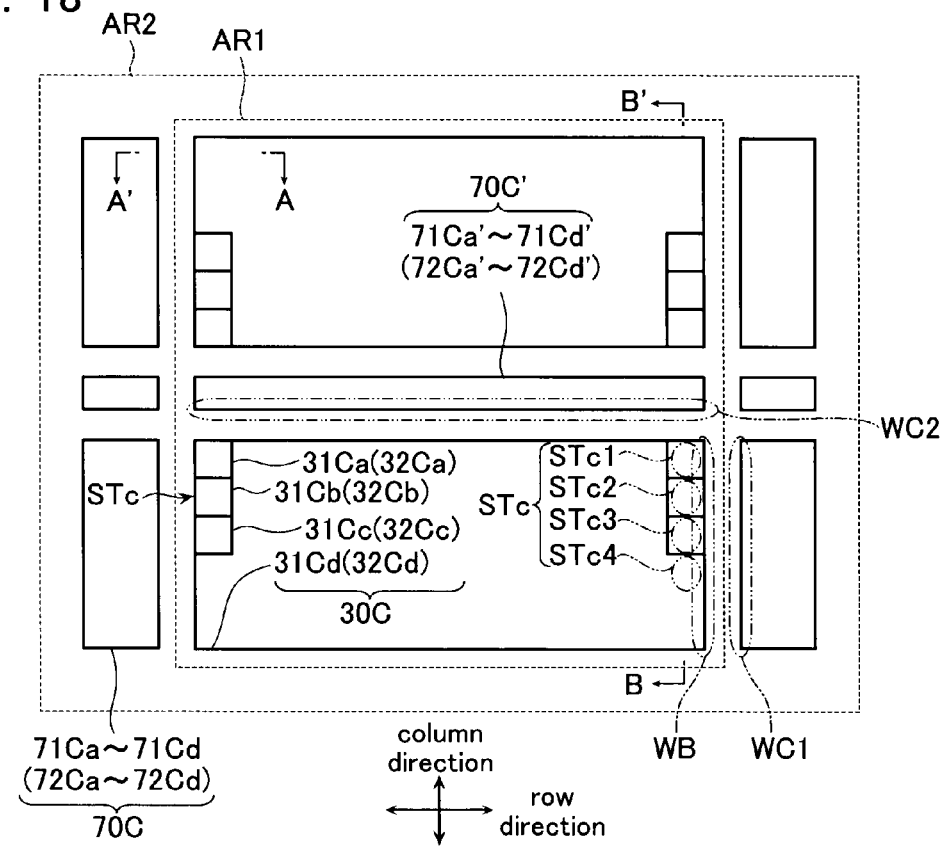
FIG. 18 is a top view showing a memory transistor layer 30C and a first dummy layer 70C in accordance with a third embodiment.

Next, a configuration of a nonvolatile semiconductor memory device in accordance with a third embodiment is described with reference to FIGS. 18-20. The nonvolatile semiconductor memory device in accordance with the third embodiment has an overall configuration which is similar to that of the first embodiment (FIGS. 1-4); however, a configuration of a memory transistor layer 30C and first dummy layers 70C and 70C' differs from that of the first embodiment. FIG. 18 is a top view showing the memory transistor layer 30C and the first dummy layer 70C in accordance with the third embodiment. Note that in the third embodiment, identical symbols are assigned to configurations similar to those in the first and second embodiments and descriptions thereof are omitted.

As described in detail hereafter, the nonvolatile semiconductor memory device in accordance with the third embodiment comprises a stepped portion STc including steps STc1-STc4 lined up in the column direction, and differs from the first embodiment in this point.

The first dummy layer 70C is formed in the peripheral region AR2, similarly to the first embodiment, as shown in FIG. 18. In contrast, the dummy layer 70C' is formed between a pair of memory transistor layers 30 arranged in the column direction in the memory region AR1. The third embodiment differs in this point from the first embodiment in which the first dummy layer 70C is included only in the memory region AR1. As described later, the first dummy layers 70C and 70C' share the same layers with the memory transistor layer 30 in the manufacturing process. The first dummy layers 70C and 70C' are formed by dividing them from the memory transistor layer 30 by etching.

Figure 19:
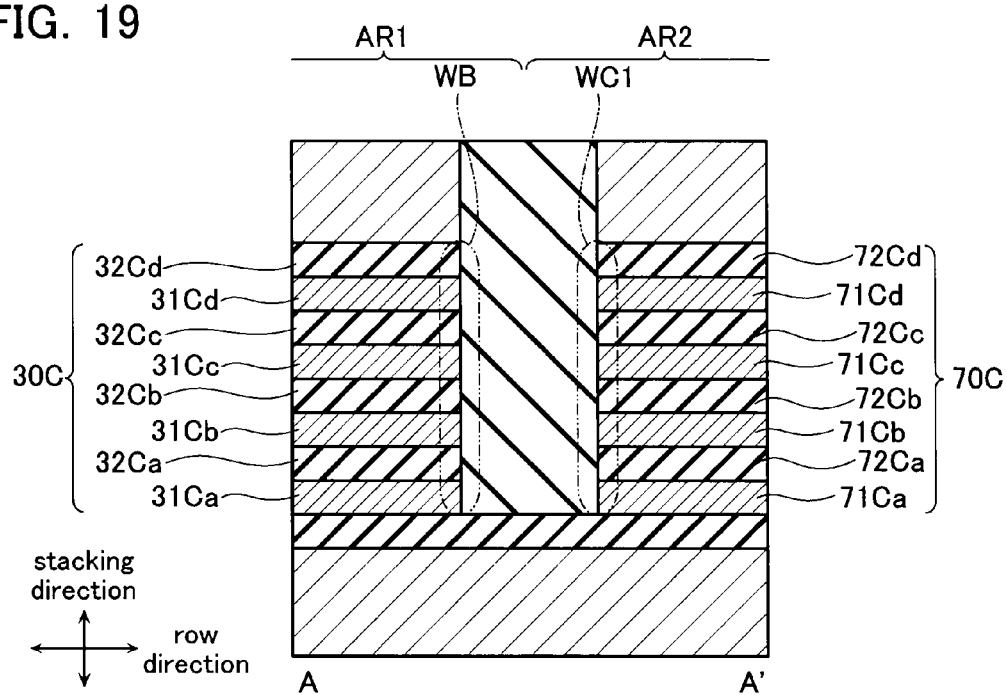
FIG. 19 is a cross-sectional view taken along the line A-A' of FIG. 18.
Figure 20:
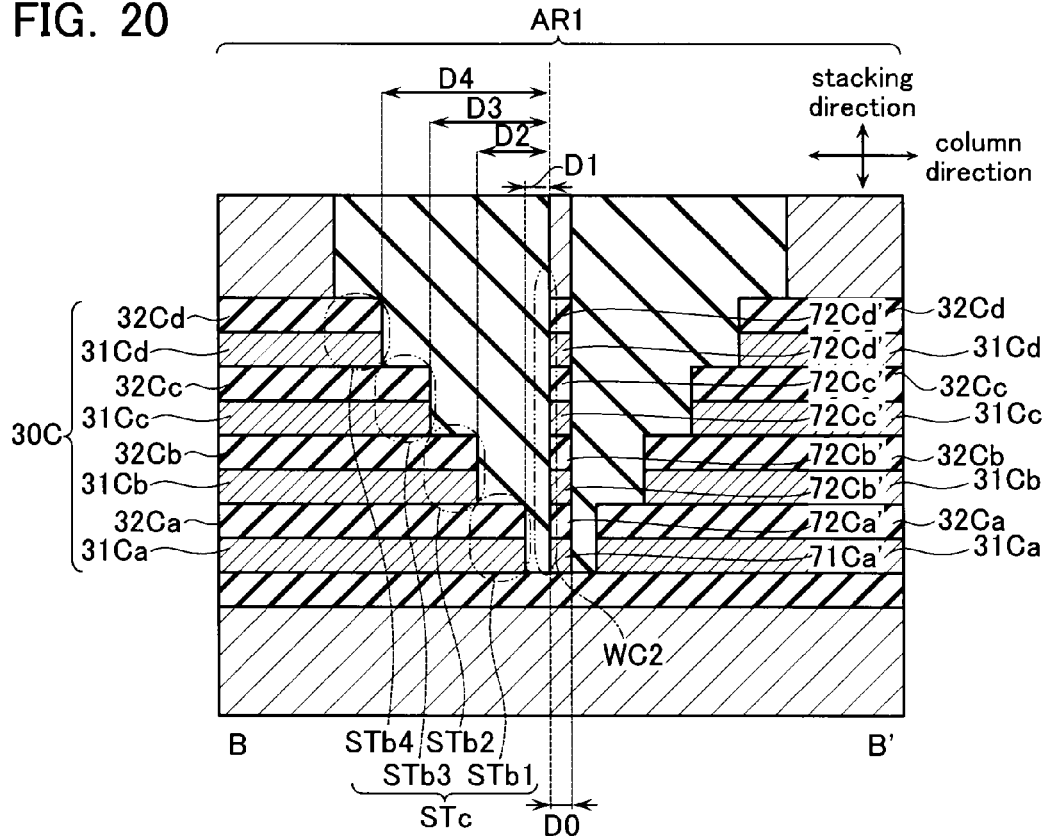
FIG. 20 is a cross-sectional view taken along the line B-B' of FIG. 18.

The memory transistor layer 30C includes first through fourth word line conductive layers 31Ca-31Cd and first through fourth inter-word line insulating layers 32Ca-32Cd, as shown in FIGS. 18-20. The first through fourth word line conductive layers 31Ca-31Cd and the first through fourth inter-word line insulating layers 32Ca-32Cd are provided to each of the memory blocks MB and formed so as to extend two-dimensionally in the row direction and the column direction (in a plate-like shape), similarly to the first embodiment.

At the end vicinities of the memory region AR1, the first through fourth word line conductive layers 31Ca-31Cd and the first through fourth inter-word line insulating layers 32Ca-32Cd are formed such that positions of ends thereof in the row direction are aligned in a direction substantially perpendicular to the semiconductor substrate Ba, as shown in FIGS. 18 and 19. That is, the ends of the first through fourth word line conductive layers 31Ca-31Cd and the first through fourth inter-word line insulating layers 32Ca-32Cd in the row direction configures a wall portion WB which is a wall surface substantially perpendicular to the semiconductor substrate Ba.

At the end vicinities of the memory region AR1, the first through fourth word line conductive layers 31Ca-31Cd and the first through fourth inter-word line insulating layers 32Ca-32Cd are formed in a stepped shape such that positions of ends thereof in the column direction differ from one another, as shown in FIGS. 18 and 20. That is, the ends of the first through fourth word line conductive layers 31Ca-31Cd and the first through fourth inter-word line insulating layers 32Ca-32Cd configure the stepped portion STc formed in a stepped shape. Further, as shown in FIG. 20, a pair of the first through fourth word line conductive layers 31Ca-31Cd and the first through fourth inter-word line insulating layers 32Ca-32Cd adjacent in the column direction with the first dummy layer 70C' interposed therebetween have a pair of the stepped portions STc formed line-symmetrically with respect to the first dummy layer 70C'. The pair of the stepped portions STc is formed descending in the column direction towards the first dummy layer 70C'. The stepped portion STc includes the steps STc1-STc4 lined up in the column direction. The third embodiment differs in this point from the first embodiment which includes the steps ST1-ST4 lined up in the row direction.

The steps STc1-STc4 are provided adjacently in the column direction from an end vicinity of the memory transistor layer 30C towards a center of the memory transistor layer 30C, as shown in FIGS. 18 and 20. The step STc1 is positioned lowest in the stepped portion STc; the step STc2 is provided above the step STc1; the step STc3 is provided above the step STc2; and the step STc4 is provided above the step STc3.

The steps STc1-STc4 are each configured by a stacked structure of one conductive layer and one insulating layer, as shown in FIG. 20. That is, the step STc1 is configured by an end of the first word line conductive layer 31Ca and an end of the first inter-word line insulating layer 32Ca; the step STc2 is configured by an end of the second word line conductive layer 31Cb and an end of the second inter-word line insulating layer 32Cb; the step STc3 is configured by an end of the third word line conductive layer 31Cc and an end of the third inter-word line insulating layer 32Cc; and the step STc4 is configured by an end of the fourth word line conductive layer 31Cd and an end of the fourth inter-word line insulating layer 32Cd. In the steps STc1-STc4, the first through fourth inter-word line insulating layers 32Ca-32Cd have an interlayer insulating layer formed on an upper surface thereof.

In the step STc1, the end of the first word line conductive layer 31Ca in the row direction is formed with a distance D1 in the column direction from a side surface of the first dummy layer 70C', as shown in FIG. 20. In the step STc2, the end of the second word line conductive layer 31Cb in the row direction is formed with a distance D2 (D2>D1) in the column direction from the side surface of the first dummy layer 70C'. In the step STc3, the end of the third word line conductive layer 31Cc in the row direction is formed with a distance D3 (D3>D2) in the column direction from the side surface of the first dummy layer 70C'. In the step STc4, the end of the fourth word line conductive layer 31Cd in the row direction is formed with a distance D4 (D4>D3) in the column direction from the side surface of the first dummy layer 70C'.

The first dummy layer 70C includes conductive layers 71Ca-71Cd and insulating layers 72Ca-72Cd, stacked alternately, as shown in FIGS. 18 and 19. The conductive layers 71Ca-71Cd are formed in the same layer as the first through fourth word line conductive layers 31Ca-31Cd. The insulating layers 72Ca-72Cd are formed in the same layer as the first through fourth inter-word line insulating layers 32Ca-32Cd.

At the end vicinity of the peripheral region AR2 which surrounds the memory region AR1, the conductive layers 71Ca-71Cd and the insulating layers 72Ca-72Cd are formed such that positions of ends thereof in the row direction are aligned in a direction substantially perpendicular to the semiconductor substrate Ba, as shown in FIGS. 18 and 19. That is, the end of the conductive layers 71Ca-71Cd and the insulating layers 72Ca-72Cd in the row direction configures a wall portion WC1 which is a wall surface substantially perpendicular to the semiconductor substrate Ba.

The first dummy layer 70C' includes conductive layers 71Ca'-71Cd' and insulating layers 72Ca'-72Cd', as shown in FIGS. 18 and 20. The conductive layers 71Ca'-71Cd' are formed in the same layer as the first through fourth word line conductive layers 31Ca-31Cd. The insulating layers 72Ca'-72Cd' are formed in the same layer as the first through fourth inter-word line insulating layers 32Ca-32Cd.

Between the memory transistor layers 30 in the memory region AR1, the conductive layers 71Ca'-71Cd' and the insulating layers 72Ca'-72Cd' are formed such that positions of ends thereof in the column direction are aligned in a direction substantially perpendicular to the semiconductor substrate Ba, as shown in FIGS. 18 and 20. That is, the ends of the conductive layers 71Ca'-71Cd' and the insulating layers 72Ca'-72Cd' in the column direction configure a wall portion WC2 which is a wall surface substantially perpendicular to the semiconductor substrate Ba. The conductive layers 71Ca'-71Cd' and the insulating layers 72Ca'-72Cd' have a width of a length D0 in the column direction.

(Method of Manufacturing the Nonvolatile Semiconductor Memory Device in Accordance with the Third Embodiment)

Figure 21:
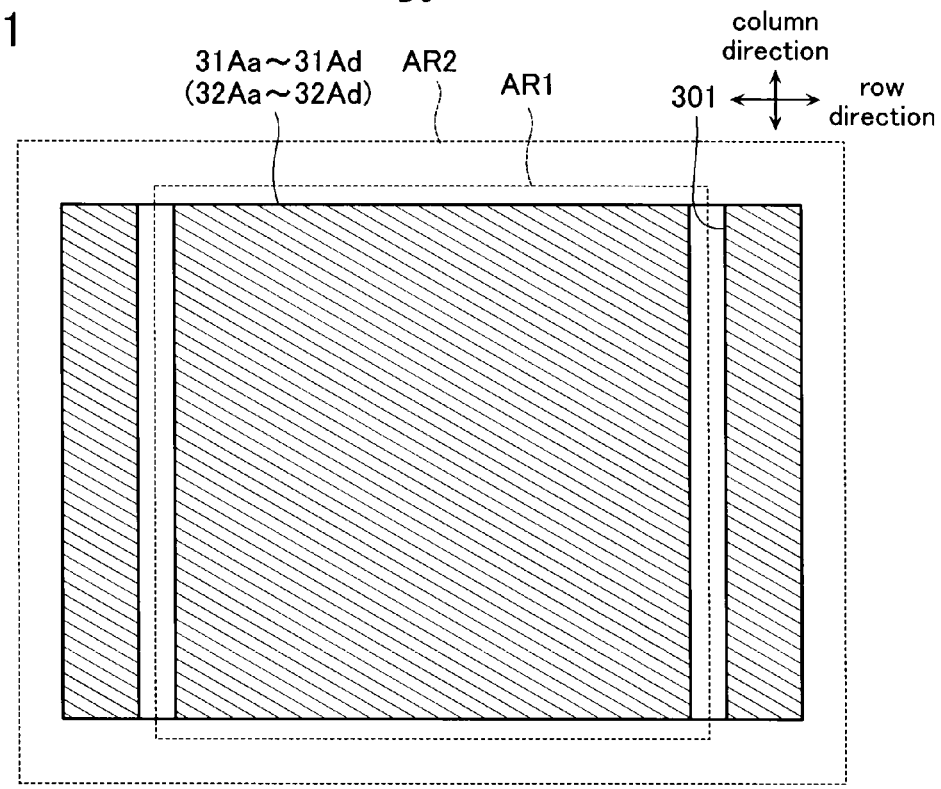
FIGS. 21-29 are top views showing a manufacturing process of a nonvolatile semiconductor memory device in accordance with the third embodiment.
Figure 22:
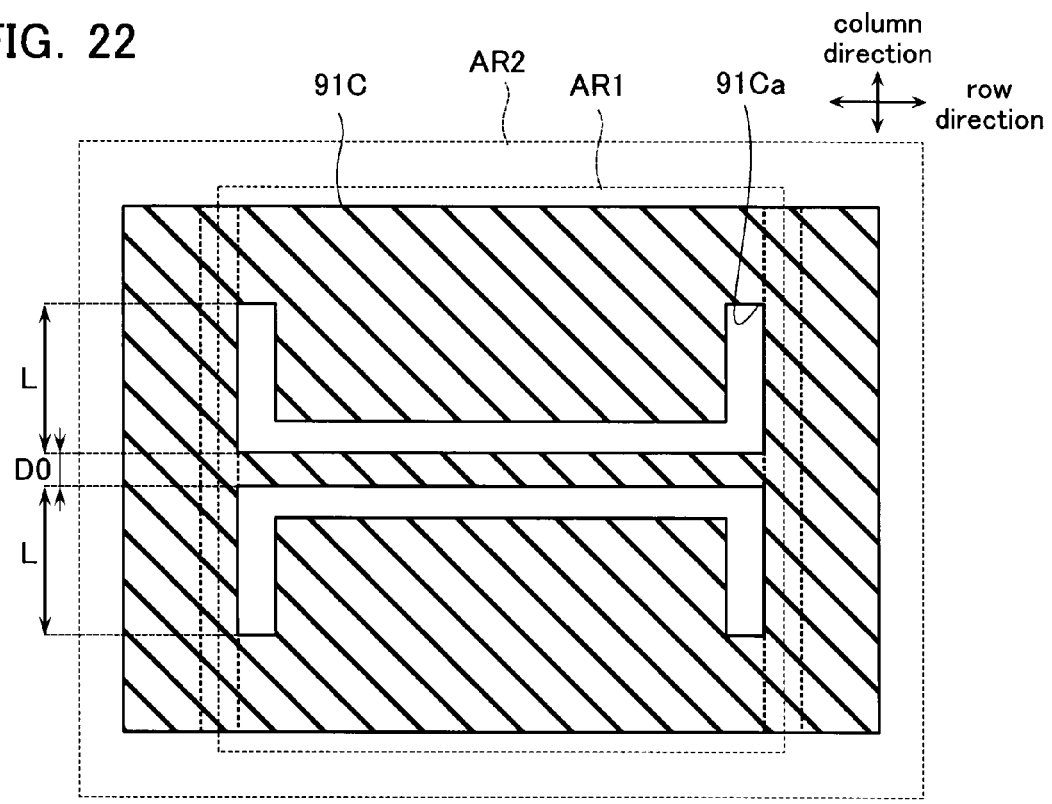

Next, a method of manufacturing the nonvolatile semiconductor memory device in accordance with the third embodiment is described with reference to FIGS. 21-29. FIGS. 21, 22, and 24 are top views showing a manufacturing process of the nonvolatile semiconductor memory device in accordance with the third embodiment. FIGS. 23 and 25-29 are cross-sectional views showing a manufacturing process of the nonvolatile semiconductor memory device in accordance with the third embodiment.

First, the layers 31Aa-31Ad, the layers 32Aa-32Ad, and the layer 41A are formed, similarly to FIG. 7 of the first embodiment.

Next, a trench 301 extending in the column direction is formed along both ends in the row direction of the memory region AR1, as shown in FIG. 21. The trench 301 is formed so as to penetrate the layers 31Aa-31Ad and the layers 32Aa-32Ad at a position corresponding to a border between the memory region AR1 and the peripheral region AR2 in the row direction.

Figure 23:
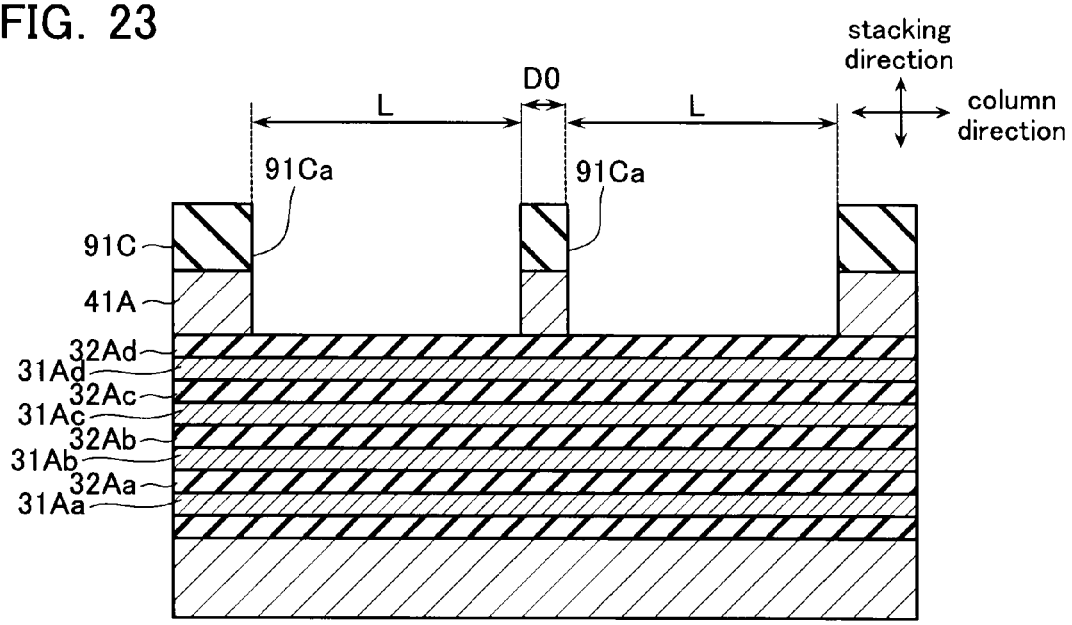
Figure 24:
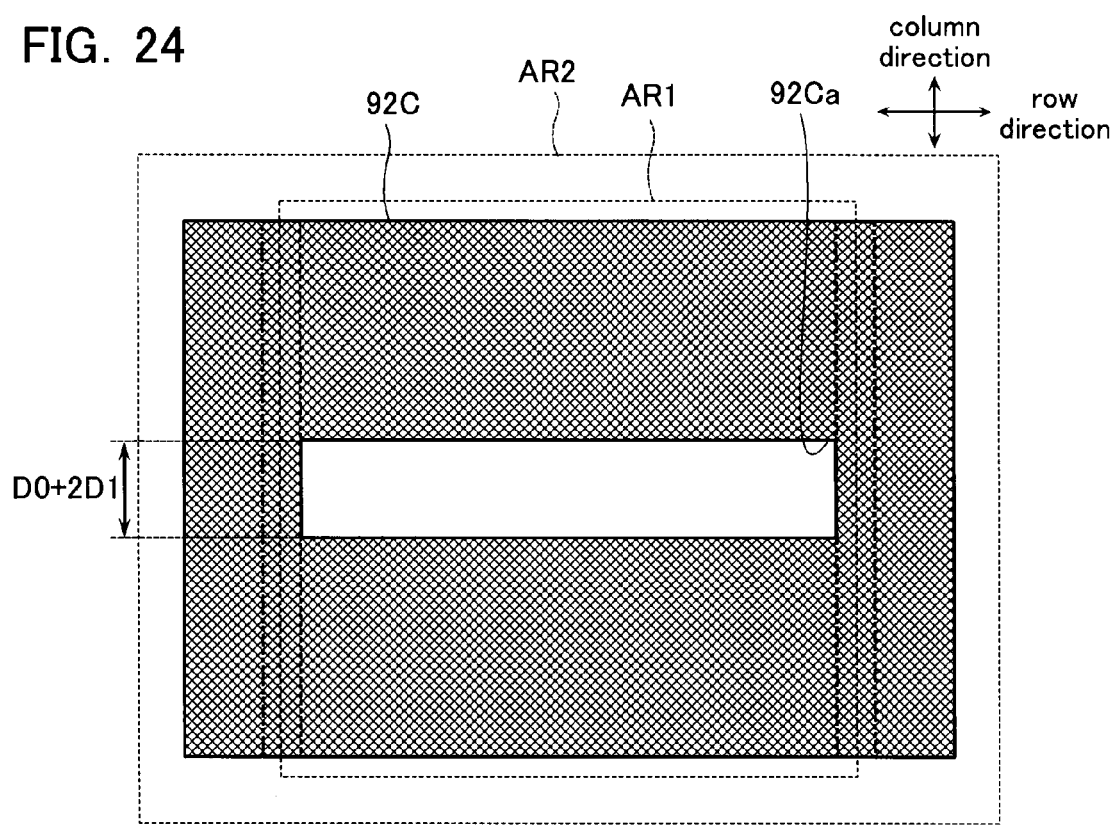

Then, a mask layer 91C is formed in a certain pattern on the layer 41A, as shown in FIGS. 22 and 23. The mask layer 91C is here provided with a penetration hole 91Ca formed so as to penetrate the mask layer 91C. The penetration hole 91Ca is formed in a truncated U-shape that links a region of both end vicinities in the row direction of the memory region AR1 (position adjacent to the trench 301) and a region corresponding to the end in the column direction of the first dummy layer 70C'. That is, the penetration hole 91Ca is formed at a position corresponding to the wall portion WC2 and the stepped portion STc. A pair of the penetration holes 91Ca adjacent in the column direction is formed with a separation D0 in the column direction. Next, the mask layer 91C is used as a mask to etch the layer 41A.

Figure 25:
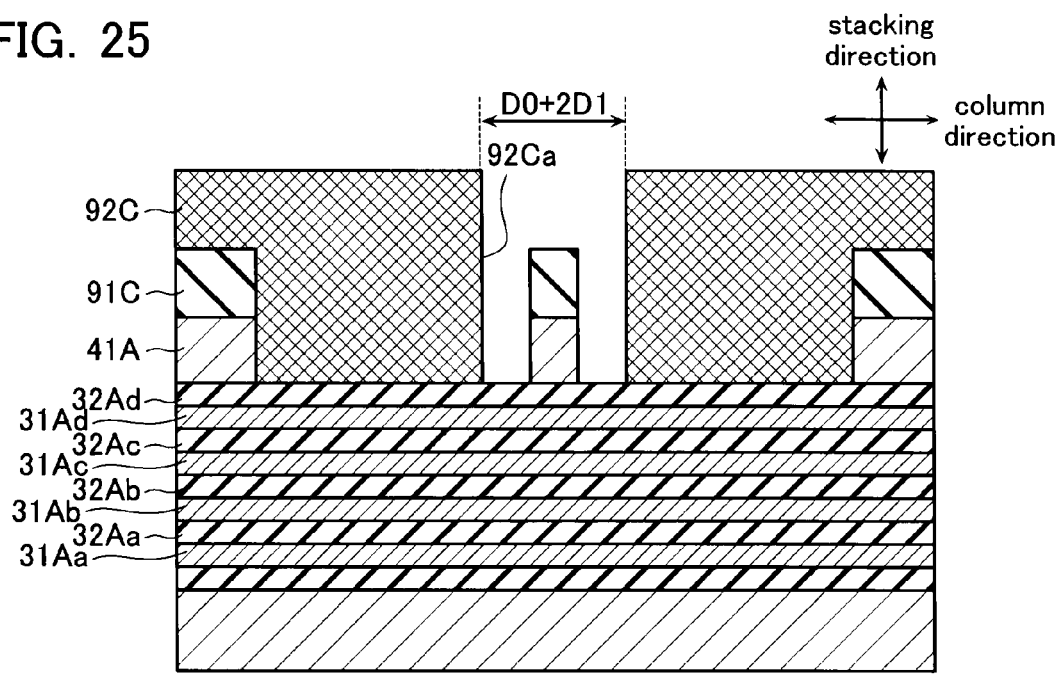

Subsequently, a resist layer 92C of a certain pattern is formed as shown in FIGS. 24 and 25. The resist layer 92C is here provided with a penetration hole 92Ca formed so as to penetrate the resist layer 92C. The penetration hole 92Ca is formed so as to include a region extending in the row direction of the adjacent pair of the penetration holes 91Ca. The penetration hole 92Ca is formed in a rectangular shape long in the row direction and having a width of a length (D0+2D1) in the column direction.

Figure 26:
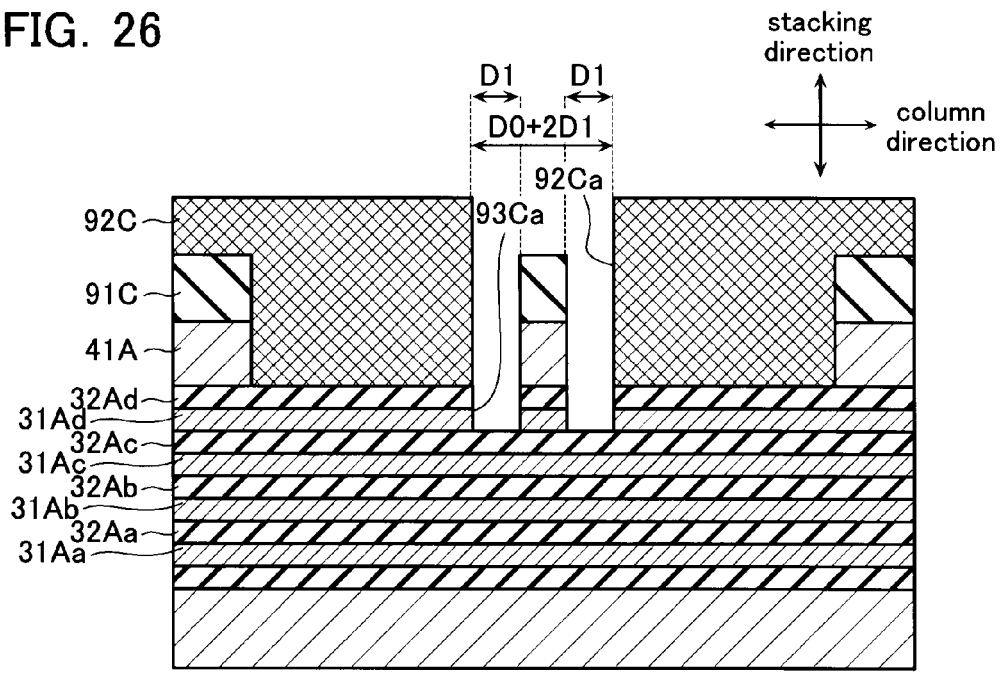

Next, etching is performed using the mask layer 91C and the resist layer 92C as a mask, thereby forming a trench 93Ca configured to penetrate the layers 31Ad and 32Ad, as shown in FIG. 26. The trench 93Ca is formed having as an end thereof a side wall of the resist layer 92C facing the penetration hole 92Ca. The trench 93Ca has a width of a length D1 in the column direction.

Figure 27:
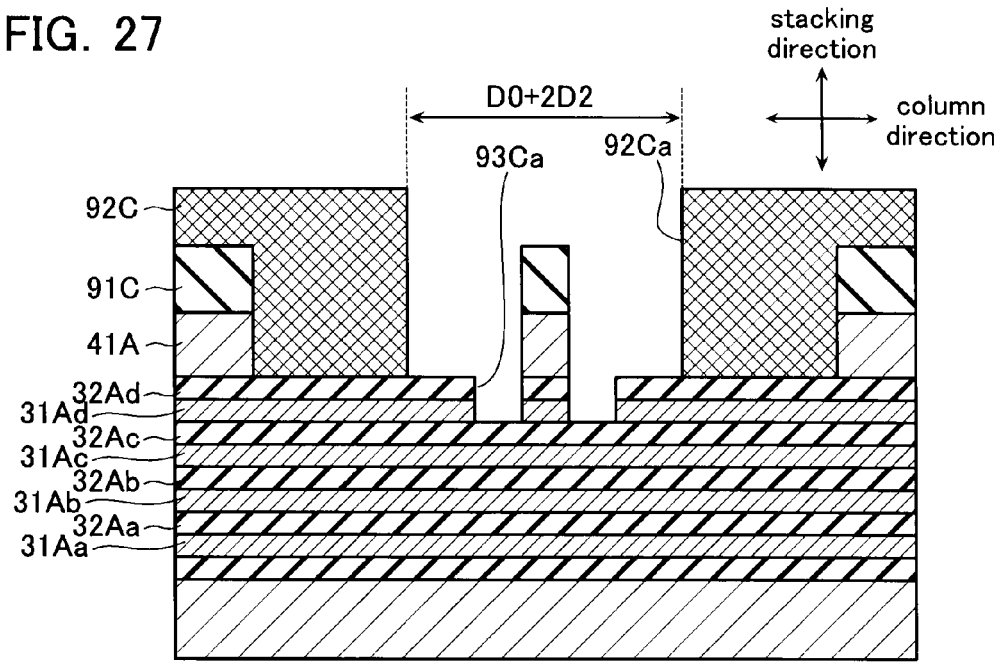

Then, slimming of the resist layer 92C from the penetration hole 92Ca in the column direction is performed, as shown in FIG. 27. Through this process, the penetration hole 92Ca has a width of a length (D0+2D2) in the column direction.

Figure 28:
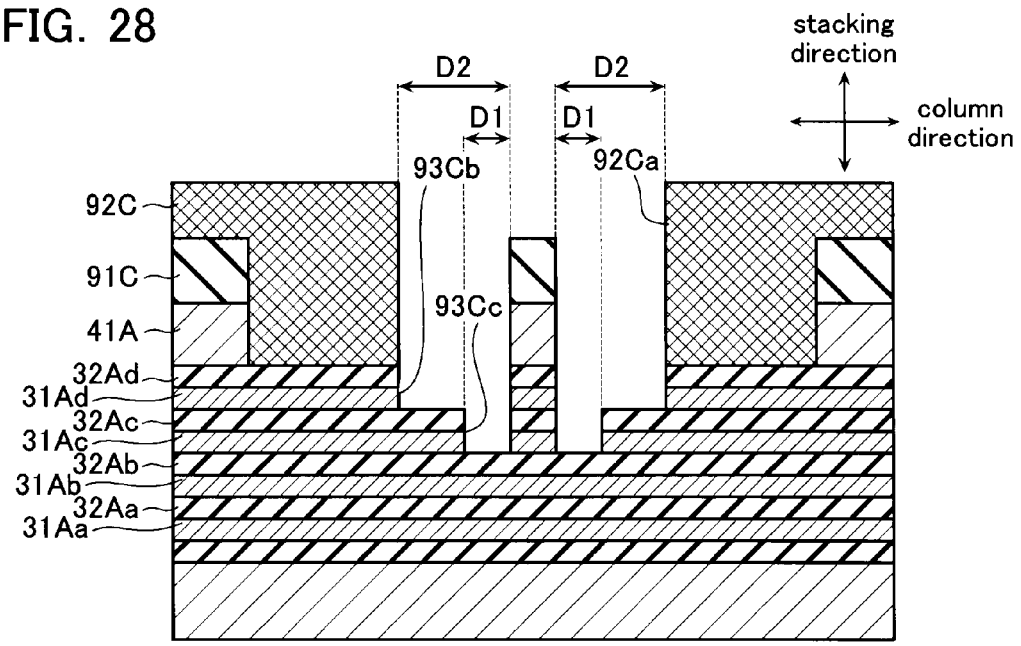

Next, etching is performed using the mask layer 91C and the resist layer 92C as a mask, thereby forming a trench 93Cb configured to penetrate the layers 31Ad and 32Ad, and similarly, a trench 93Cc configured to penetrate the layers 31Ac and 32Ac, as shown in FIG. 28. The trench 93Cb is formed having as an end thereof the side wall of the resist layer 92C facing the penetration hole 92Ca. The trench 93Cb has a width of a length D2 in the column direction. The trench 93Cc is formed having as an end thereof a side surface of the resist layer 92C facing the penetration hole 92Ca. The trench 93Cb has a width of a length D1 in the column direction.

Figure 29:
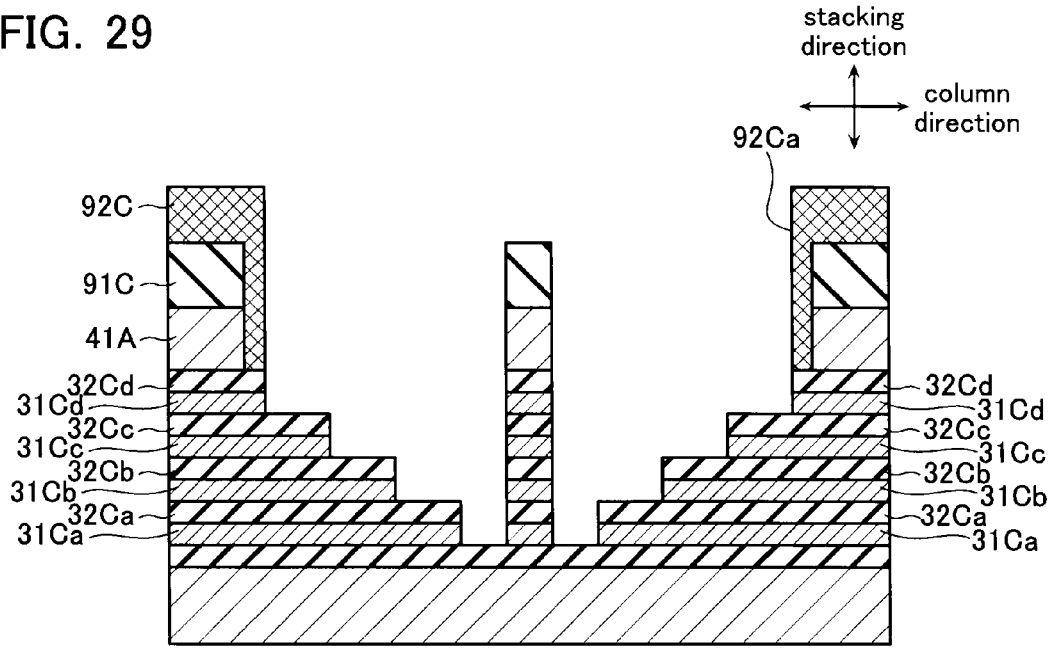

Then, as shown in FIG. 29, the slimming of the resist layer 92C from the penetration hole 92Ca in the column direction and the etching shown in FIGS. 27 and 28 are repeatedly performed, whereby the layers 31Aa-31Ad become the first through fourth word line conductive layers 31Ca-31Cd.

(Advantages of the Nonvolatile Semiconductor Memory Device in Accordance with the Third Embodiment)

The nonvolatile semiconductor memory device in accordance with the third embodiment includes the stepped portion STc and the wall portions WA, WB, and WC, and displays similar advantages to the first embodiment. Moreover, in the third embodiment, the stepped portion STc has the steps STc1-STc4 lined up in the column direction. Consequently, in the nonvolatile semiconductor memory device in accordance with the third embodiment, an occupied area in the row direction can be reduced more than in the first embodiment which has the steps ST1-ST4 lined up in the row direction.

[Fourth Embodiment]

(Configuration of a Nonvolatile Semiconductor Memory Device in Accordance with a Fourth Embodiment)

Figure 30:
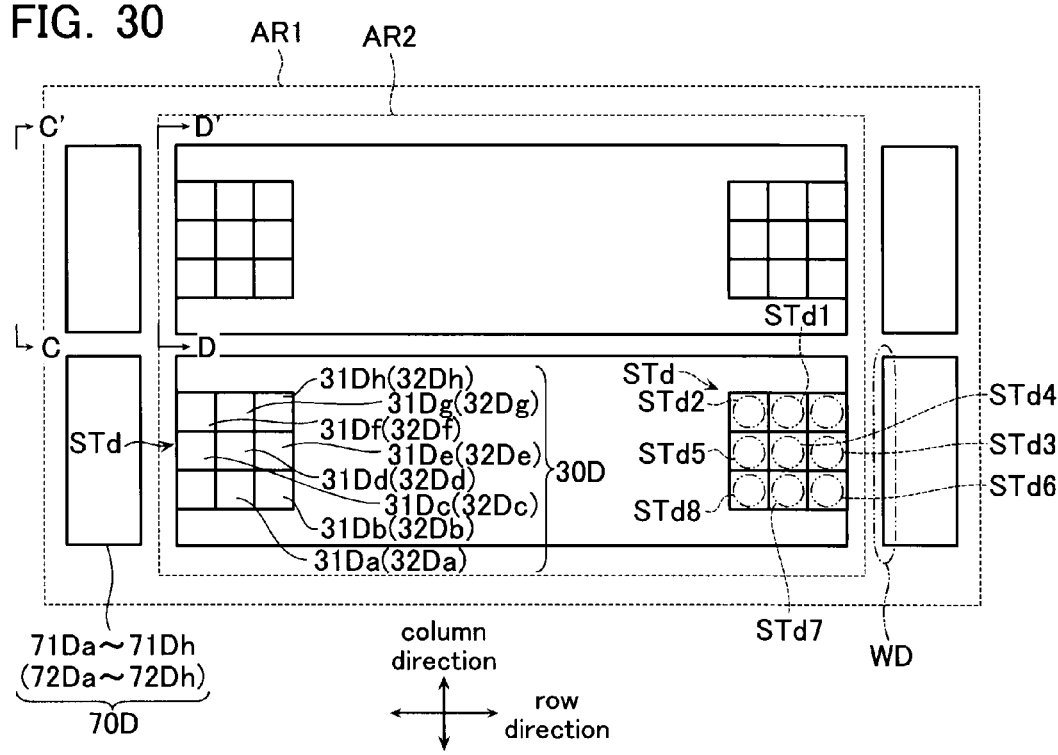
FIG. 30 is a top view showing a memory transistor layer 30D and a first dummy layer 70D in accordance with a fourth embodiment.
Figure 31:
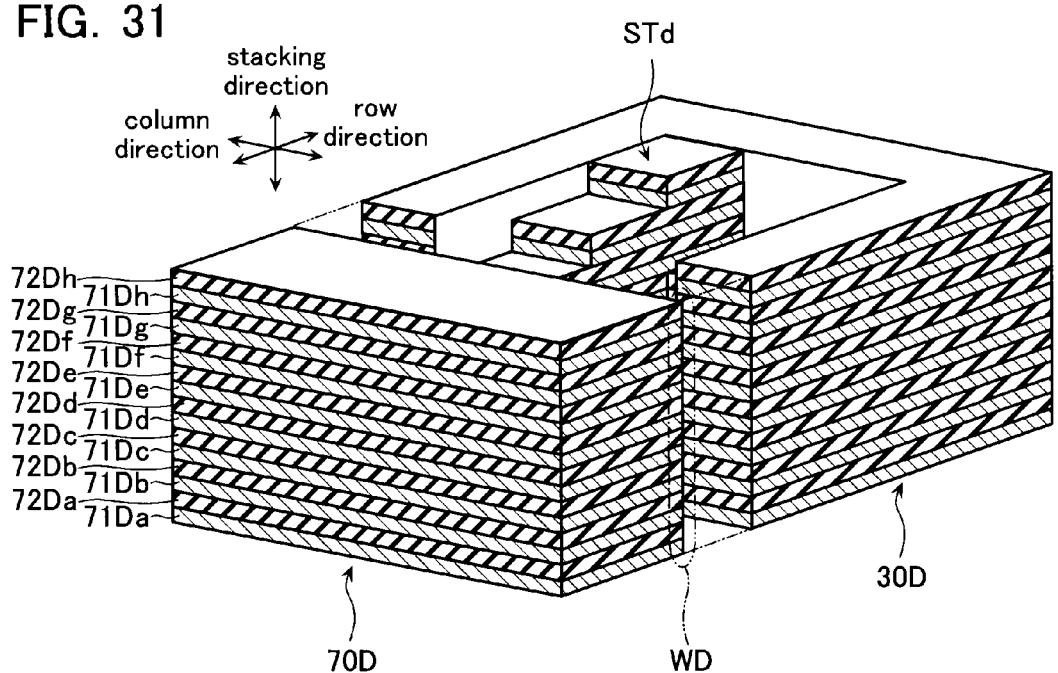
FIG. 31 is a perspective view as seen from the direction of the arrows C-C' of FIG. 30.
Figure 32:
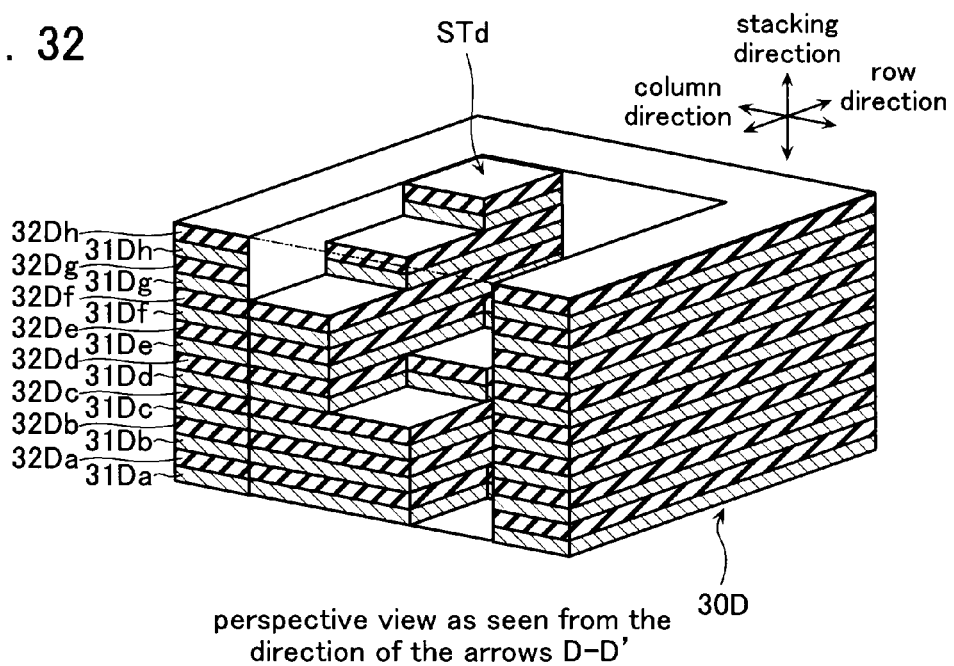
FIG. 32 is a perspective view as seen from the direction of the arrows D-D' of FIG. 30.
Figure 33:
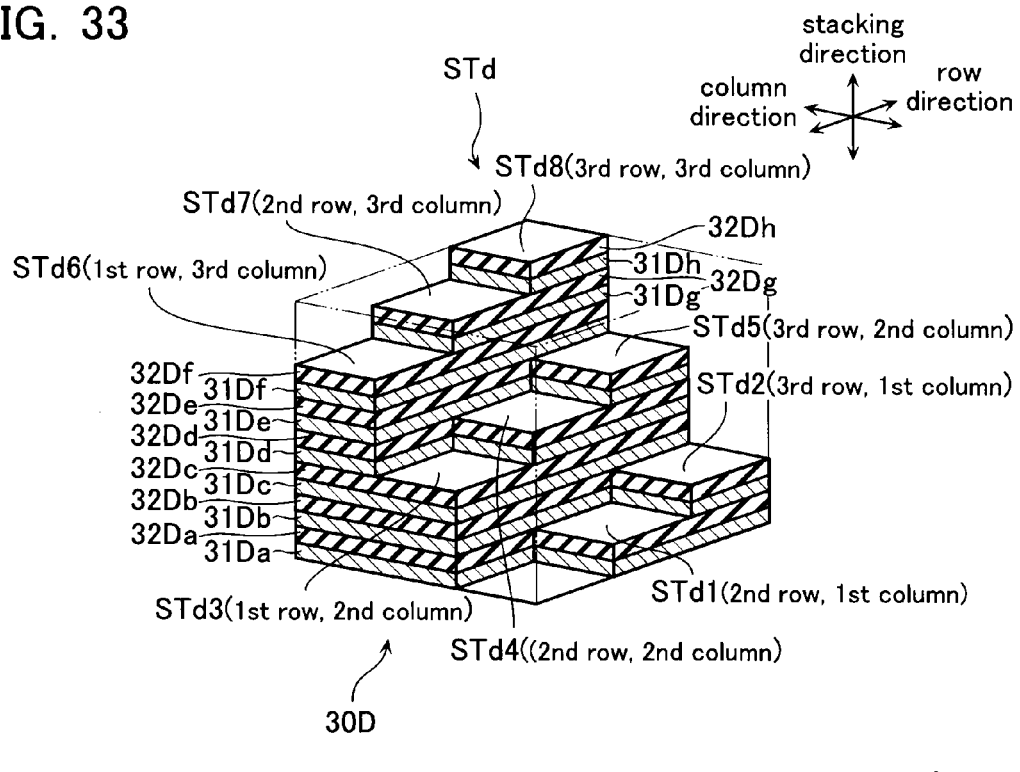
FIG. 33 is a view of FIG. 32 having a portion thereof omitted.

Next, a configuration of a nonvolatile semiconductor memory device in accordance with a fourth embodiment is described with reference to FIGS. 30-33. The nonvolatile semiconductor memory device in accordance with the fourth embodiment has an overall configuration which is similar to that of the first embodiment (FIGS. 1-4); however, a configuration of a memory transistor layer 30D and a first dummy layer 70D differs from that of the first embodiment. FIG. 30 is a top view showing the memory transistor layer 30D and the first dummy layer 70D in accordance with the fourth embodiment. FIG. 31 is a perspective view as seen from the direction of the arrows C-C' of FIG. 30. FIG. 32 is a perspective view as seen from the direction of the arrows D-D' of FIG. 30. FIG. 33 is a view of FIG. 32 having a portion thereof omitted. FIGS. 30-33 do not show interlayer insulating layers. Note that in the fourth embodiment, identical symbols are assigned to configurations similar to those in the first through third embodiments and descriptions thereof are omitted.

As described in detail hereafter, the nonvolatile semiconductor memory device in accordance with the fourth embodiment comprises a stepped portion STd including steps STd1-STd8 arranged in a matrix in the row direction and the column direction, and differs from the first embodiment in this point. As described later, the first dummy layer 70D shares the same layers with the memory transistor layer 30 in the manufacturing process. The first dummy layer 70D is formed by dividing it from the memory transistor layer 30 by etching.

The memory transistor layer 30D includes first through eighth word line conductive layers 31Da-31Dh and first through eighth inter-word line insulating layers 32Da-32Dh, stacked alternately, as shown in FIGS. 30, 32, and 33. The first through eighth word line conductive layers 31Da-31Dh and the first through eighth inter-word line insulating layers 32Da-32Dh are provided to each of the memory blocks MB and formed so as to extend two-dimensionally in the row direction and the column direction (in a plate-like shape), similarly to the first embodiment.

At the end vicinities of the memory region AR1 in the row direction, the first through eighth word line conductive layers 31Da-31Dh and the first through eighth inter-word line insulating layers 32Da-32Dh are formed in a stepped shape such that positions of ends thereof in the row direction and the column direction differ from one another, as shown in FIGS. 30 and 33. That is, the ends of the first through eighth word line conductive layers 31Da-31Dh and the first through eighth inter-word line insulating layers 32Da-32Dh configure the stepped portion STd formed in a stepped shape. The stepped portion STd is formed so as to descend in the row direction and the column direction towards the peripheral region AR2, as shown in FIG. 33. The stepped portion STd includes the steps STd1-STd8 arranged in a matrix in the row direction and the column direction. The fourth embodiment differs in this point from the first embodiment which includes the steps ST1-ST4 lined up in the row direction.

The steps STd1-STd8 are positioned in a matrix of three rows in the row direction and three columns in the column direction, as shown in FIGS. 30 and 33. Here, the step STd1 is disposed at a position of the second row in the row direction and the first column in the column direction; the step STd2 is disposed at a position of the third row in the row direction and the first column in the column direction; the step STd3 is disposed at a position of the first row in the row direction and the second column in the column direction; the step STd4 is disposed at a position of the second row in the row direction and the second column in the column direction; the step STd5 is disposed at a position of the third row in the row direction and the second column in the column direction; the step STd6 is disposed at a position of the first row in the row direction and the third column in the column direction; the step STd7 is disposed at a position of the second row in the row direction and the third column in the column direction; and the step STd8 is disposed at a position of the third row in the row direction and the third column in the column direction.

The step STd1 is positioned lowest in the stepped portion STd; the step STd2 is provided above the step STd1; the step STd3 is provided above the step STd2; the step STd4 is provided above the step STd3; the step STd5 is provided above the step STd4; the step STd6 is provided above the step STd5; the step STd7 is provided above the step STd6; and the step STd8 is provided above the step STd7.

The steps STd1-STd8 are each configured by a stacked structure of one conductive layer and one insulating layer, as shown in FIG. 33. That is, the step STd1 is configured by an end of the first word line conductive layer 31Da and an end of the first inter-word line insulating layer 32Da; the step STd2 is configured by an end of the second word line conductive layer 31Db and an end of the second inter-word line insulating layer 32Db; the step STd3 is configured by an end of the third word line conductive layer 31Dc and an end of the third inter-word line insulating layer 32Dc; the step STd4 is configured by an end of the fourth word line conductive layer 31Dd and an end of the fourth inter-word line insulating layer 32Dd; the step STd5 is configured by an end of the fifth word line conductive layer 31De and an end of the fifth inter-word line insulating layer 32De; the step STd6 is configured by an end of the sixth word line conductive layer 31Df and an end of the sixth inter-word line insulating layer 32Df; the step STd7 is configured by an end of the seventh word line conductive layer 31Dg and an end of the seventh inter-word line insulating layer 32Dg; and the step STd8 is configured by an end of the eighth word line conductive layer 31Dh and an end of the eighth inter-word line insulating layer 32Dh. In the steps STd1-STd8, the first through eighth inter-word line insulating layers 32Da-32Dh have an interlayer insulating layer formed on an upper surface thereof.

The first dummy layer 70D includes conductive layers 71Da-71Dh and insulating layers 72Da-72Dh, stacked alternately, as shown in FIGS. 30 and 31. The conductive layers 71Da-71Dh are formed in the same layer as the first through eighth word line conductive layers 31Da-31Dh. The insulating layers 72Da-72Dh are formed in the same layer as the first through eighth inter-word line insulating layers 32Da-32Dh.

At the end vicinity of the peripheral region AR2 which surrounds the memory region AR1, the conductive layers 71Da-71Dh and the insulating layers 72Da-72Dh are formed such that positions of ends thereof in the row direction are aligned in a direction substantially perpendicular to the semiconductor substrate Ba, as shown in FIGS. 30 and 31. That is, the end of the conductive layers 71Da-71Dh and the insulating layers 72Da-72Dh in the row direction configures a wall portion WD which is a wall surface substantially perpendicular to the semiconductor substrate Ba.

(Method of Manufacturing the Nonvolatile Semiconductor Memory Device in Accordance with the Fourth Embodiment)

Figure 36:
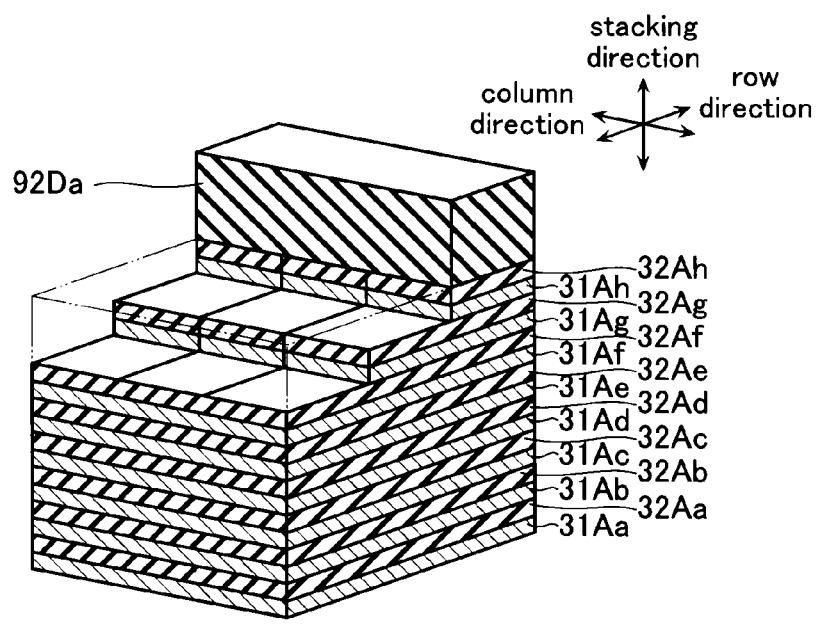
Figure 37:
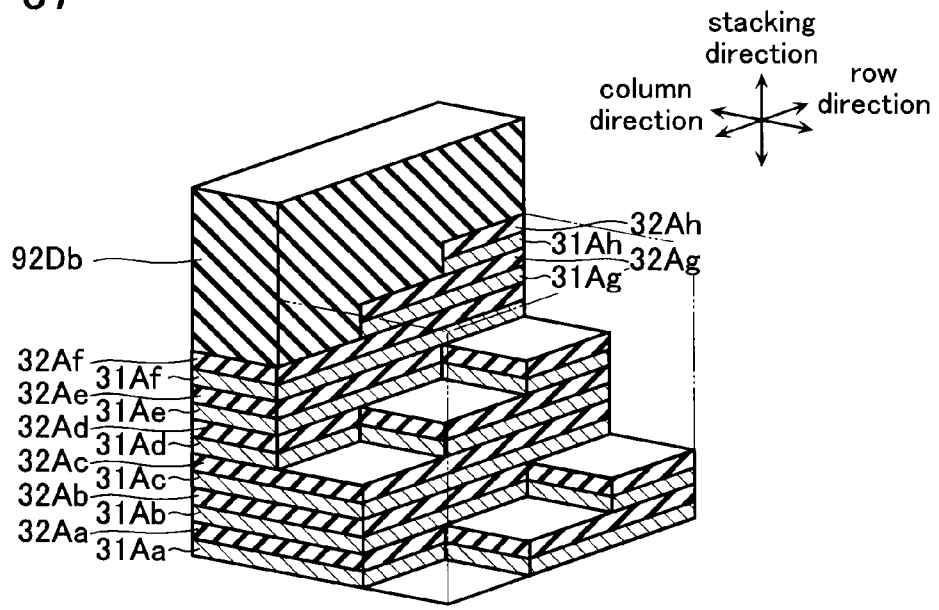

Next, a method of manufacturing the nonvolatile semiconductor memory device in accordance with the fourth embodiment is described with reference to FIGS. 34-37. FIGS. 34-37 are schematic perspective views showing a manufacturing process of the nonvolatile semiconductor memory device in accordance with the fourth embodiment. Note that FIGS. 36 and 37 show only a region that becomes the stepped portion STd.

Figure 34:
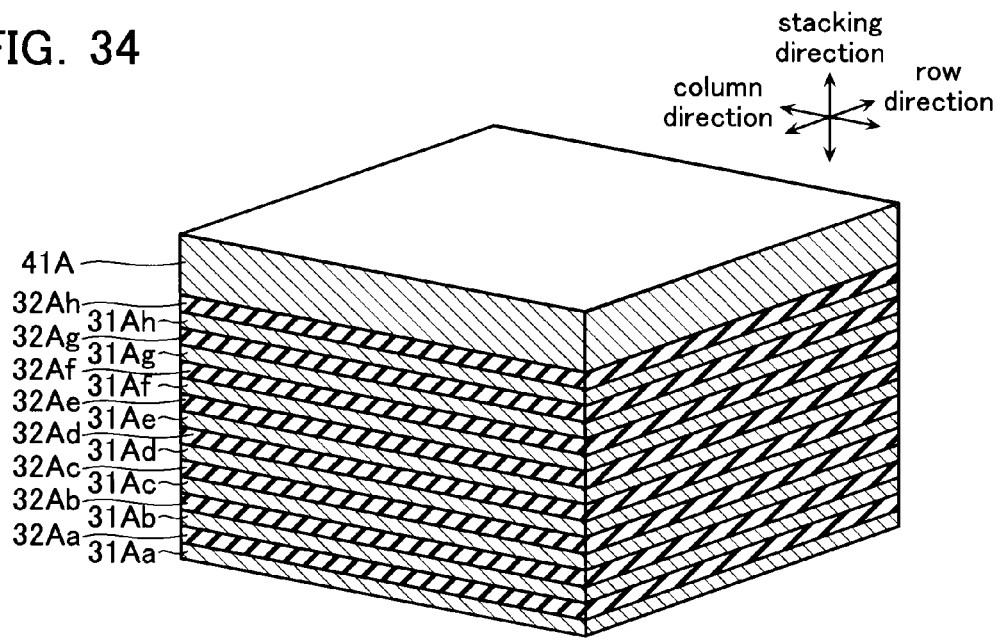
FIGS. 34-37 are schematic perspective views showing a manufacturing process of a nonvolatile semiconductor memory device in accordance with the fourth embodiment.

First, polysilicon (p-Si) and silicon oxide ($SiO_2$) are alternately deposited to form the layers 31Aa-31Ah, the layers 32Aa-32Ah, and the layer 41A, as shown in FIG. 34. Next, the trench 301 is formed at the ends in the row direction of the memory region AR1, similarly to the process shown in FIG. 21 of the third embodiment. The trench 301 is formed extending in the column direction so as to penetrate the layers 31Aa-31Ah, the layers 32Aa-32Ah, and the layer 41A.

Figure 35:
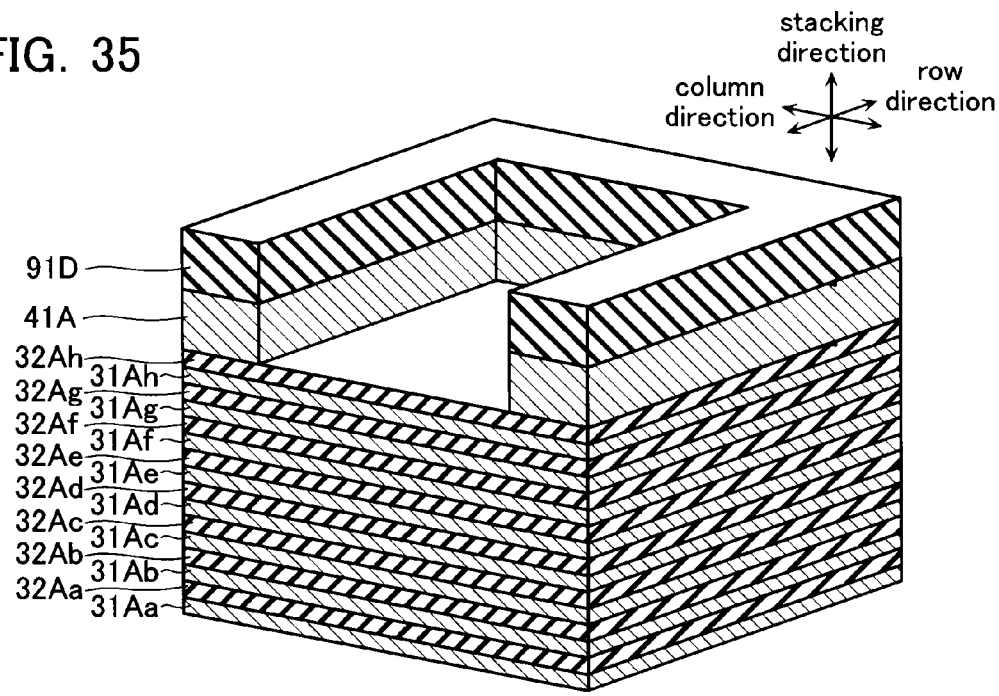

Then, a mask layer 91D is formed on the layer 41A except for a region corresponding to the stepped portion STd, as shown in FIG. 35. Next, etching is performed on the layer 41A using the mask layer 91D as a mask. Through this process, an end in the row direction of the layer 41A attains a concavely recessed shape.

Subsequently, a resist layer 92Da is formed on the mask layer 91D. Then, slimming of the resist layer 92Da in the row direction and etching are repeatedly executed, as shown in FIG. 36. Next, a resist layer 92Db is formed. Then, slimming of the resist layer 92Db in the column direction and etching are repeatedly executed, as shown in FIG. 37. Note that in FIGS. 36 and 37, a single etching is performed so as to penetrate one conductive layer and one insulating layer. The stepped portion STd is formed through these processes.

(Advantages of the Nonvolatile Semiconductor Memory Device in Accordance with the Fourth Embodiment)

The nonvolatile semiconductor memory device in accordance with the fourth embodiment includes the stepped portion STd and the wall portion WD, and displays similar advantages to the first embodiment.

[Fifth Embodiment]

(Configuration of a Nonvolatile Semiconductor Memory Device in Accordance with a Fifth Embodiment)

Figure 38:
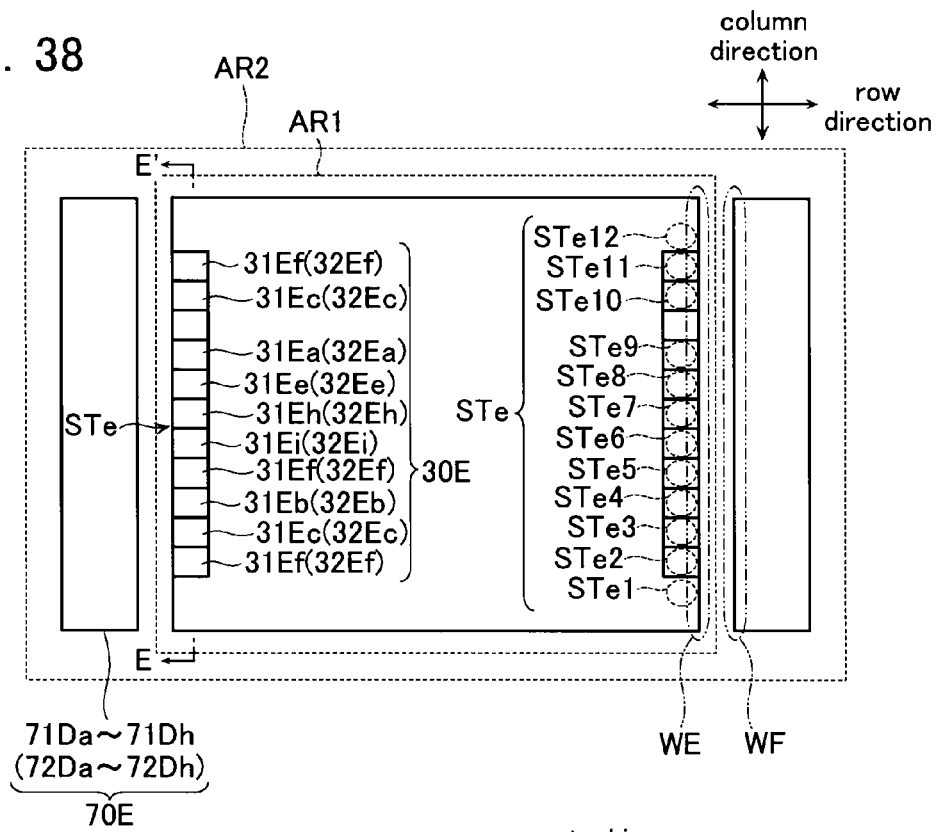
FIG. 38 is a top view showing a memory transistor layer 30E and a first dummy layer 70E in accordance with a fifth embodiment.
Figure 39:
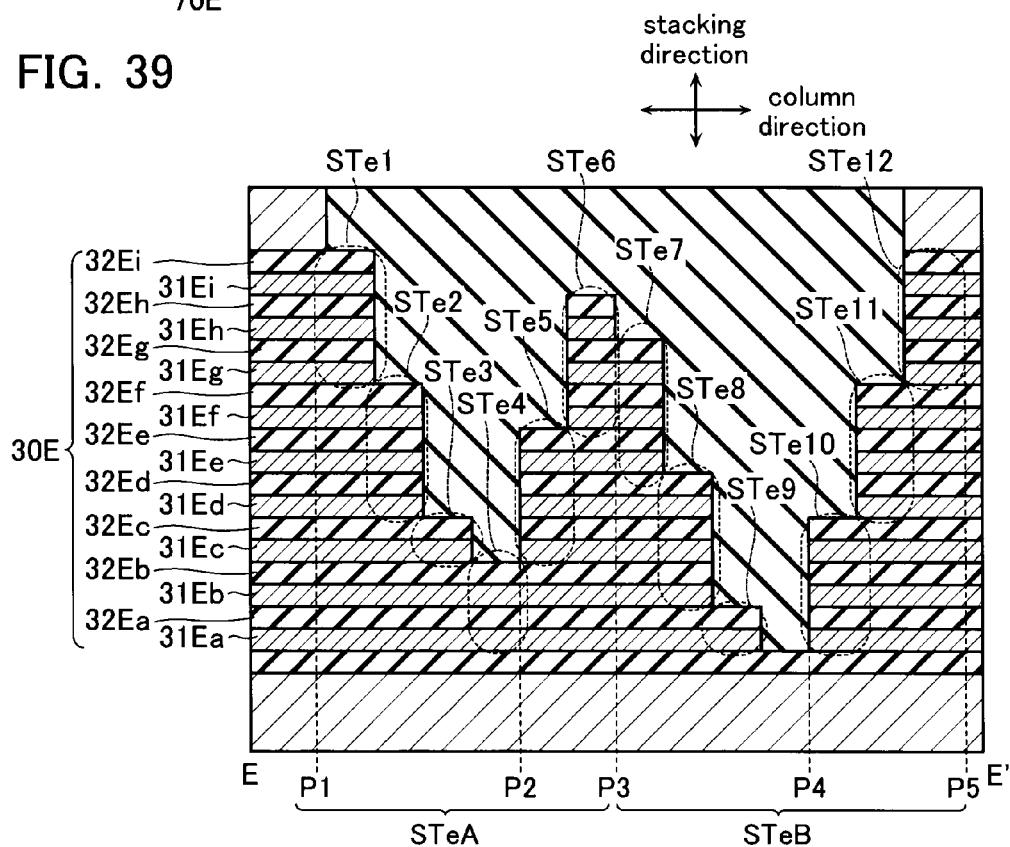
FIG. 39 is a cross-sectional view taken along the line E-E' of FIG. 38.

Next, a configuration of a nonvolatile semiconductor memory device in accordance with a fifth embodiment is described with reference to FIGS. 38 and 39. The nonvolatile semiconductor memory device in accordance with the fifth embodiment has an overall configuration which is similar to that of the first embodiment (FIGS. 1-4); however, a configuration of a memory transistor layer 30E and a first dummy layer 70E differs from that of the first embodiment. FIG. 38 is a top view showing the memory transistor layer 30E and the first dummy layer 70E in accordance with the fifth embodiment. FIG. 39 is a cross-sectional view taken along the line E-E' of FIG. 38. Note that in the fifth embodiment, identical symbols are assigned to configurations similar to those in the first through fourth embodiments and descriptions thereof are omitted.

As shown in FIG. 39 and described in detail hereafter, the nonvolatile semiconductor memory device in accordance with the fifth embodiment includes a stepped portion STe formed in a W-shape which is asymmetrical when viewed from the row direction, and differs from the first embodiment in this point. As described later, the first dummy layer 70E shares the same layers with the memory transistor layer 30E, but it is formed by dividing it from the memory transistor layer 30E by etching.

The memory transistor layer 30E includes first through ninth word line conductive layers 31Ea-31Ei and first through ninth inter-word line insulating layers 32Ea-32Ei, stacked alternately, as shown in FIGS. 38 and 39. The first through ninth word line conductive layers 31Ea-31Ei and the first through ninth inter-word line insulating layers 32Ea-32Ei are provided to each of the memory blocks MB and formed so as to extend two-dimensionally in the row direction and the column direction (in a plate-like shape), similarly to the first embodiment.

At the end vicinities of the memory region AR1, the first through ninth word line conductive layers 31Ea-31Ei and the first through ninth inter-word line insulating layers 32Ea-32Ei are formed such that positions of ends thereof in the row direction are aligned in a direction substantially perpendicular to the semiconductor substrate Ba, as shown in FIG. 38. That is, the ends of the first through ninth word line conductive layers 31Ea-31Ei and the first through ninth inter-word line insulating layers 32Ea-32Ei in the row direction configures a wall portion WE which is a wall surface substantially perpendicular to the semiconductor substrate Ba.

The first through ninth word line conductive layers 31Ea-31Ei and the first through ninth inter-word line insulating layers 32Ea-32Ei are formed in a stepped shape such that positions of ends thereof in the column direction differ from one another, as shown in FIGS. 38 and 39. That is, the ends of the first through ninth word line conductive layers 31Ea-31Ei and the first through ninth inter-word line insulating layers 32Ea-32Ei configure the stepped portion STe formed in a stepped shape. Further, as shown in FIG. 39, the stepped portion STe is formed in a W-shape which is asymmetrical when viewed from the row direction.

The stepped portion STe includes a first stepped portion STeA and a second stepped portion STeB, as shown in FIG. 39. The first stepped portion STeA is formed so as to decrease in height in a stepwise manner proceeding from a position P1 to a position P2 in the column direction, and to increase in height in a stepwise manner proceeding from the position P2 to a position P3 in the column direction. The second stepped portion STeB is formed so as to decrease in height in a stepwise manner proceeding from the position P3 to a position P4 in the column direction, and to increase in height in a stepwise manner proceeding from the position P4 to a position P5 in the column direction. The first stepped portion STeA and the second stepped portion STeB each have an asymmetrical shape.

The stepped portion STe includes the steps STe1-STe12 arranged in a line in the column direction.

As shown in FIGS. 38 and 39, the steps STe1-STe9 are provided adjacently in sequence in the column direction. A space of a certain length in the column direction is provided between the step STe9 and the step STe10. The steps STe10-Ste12 are provided adjacently in sequence in the column direction.

As shown in FIG. 39, the step STe1 is formed above the step STe2 (uppermost layer); the step STe2 is formed above the step STe3; the step STe3 is formed above the step STe4; the step STe4 is formed below the step STe3 (lowermost layer); the step STe5 is formed above the step STe4; the step STe6 is formed above the step STe5; the step STe7 is formed above the step STe8; the step STe8 is formed above the step STe9; the step STe9 is formed below the step STe8 (lowermost layer); the step STe10 is formed below the step STe11 (lowermost layer); the step STe11 is formed above the step STe10; and the step STe12 is formed above the step STe11.

The steps STe1, STe2, STe5-STe8, and STe10-STe12 are configured by a stacked structure of three conductive layers and three insulating layers, as shown in FIG. 39. That is, the step STe1 is configured by an end of the seventh through ninth word line conductive layers 31Eg-31Ei and an end of the seventh through ninth inter-word line insulating layers 32Eg-32Ei; the step STe2 is configured by an end of the fourth through sixth word line conductive layers 31Ed-31Ef and an end of the fourth through sixth inter-word line insulating layers 32Ed-32Ef; the step STe5 is configured by an end of the third through fifth word line conductive layers 31Ec-31Ee and an end of the third through fifth inter-word line insulating layers 32Ec-32Ee; the step STe6 is configured by an end of the sixth through eighth word line conductive layers 31Ef-31Eh and an end of the sixth through eighth inter-word line insulating layers 32Ef-32Eh; the step STe7 is configured by an end of the fifth through seventh word line conductive layers 31Ee-31Eg and an end of the fifth through seventh inter-word line insulating layers 32Ee-32Eg; the step STe8 is configured by an end of the second through fourth word line conductive layers 31Eb-31Ed and an end of the second through fourth inter-word line insulating layers 32Eb-32Ed; the step STe10 is configured by an end of the first through third word line conductive layers 31Ea-31Ec and an end of the first through third inter-word line insulating layers 32Ea-32Ec; the step STe11 is configured by an end of the fourth through sixth word line conductive layers 31Ed-31Ef and an end of the fourth through sixth inter-word line insulating layers 32Ed-32Ef; and the step STe12 is configured by an end of the seventh through ninth word line conductive layers 31Eg-31Ei and an end of the seventh through ninth inter-word line insulating layers 32Eg-32Ei.

The step STe4 is configured by a stacked structure of two conductive layers and two insulating layers, as shown in FIG. 39. That is, the step STe4 is configured by an end of the first and second word line conductive layers 31Ea and 31Eb, and an end of the first and second inter-word line insulating layers 32Ea and 32Eb.

The steps STe3 and STe9 are configured by a stacked structure of one conductive layer and one insulating layer, as shown in FIG. 39. That is, the step STe3 is configured by an end of the third word line conductive layer 31Ec and an end of the third inter-word line insulating layer 32Ec; and the step STe9 is configured by an end of the first word line conductive layer 31Ea and an end of the first inter-word line insulating layer 32Ea.

The first dummy layer 70E includes conductive layers 71Ea-71Ei and insulating layers 72Ea-72Ei, stacked alternately. The conductive layers 71Ea-71Ei are formed in the same layer as the first through ninth word line conductive layers 31Ea-31Ei. The insulating layers 72Ea-72Ei are formed in the same layer as the first through ninth inter-word line insulating layers 32Ea-32Ei.

At the end vicinity of the peripheral region AR2 which surrounds the memory region AR1, the conductive layers 71Ea-71Ei and the insulating layers 72Ea-72Ei are formed such that a position of an end thereof in the row direction is aligned in a direction substantially perpendicular to the semiconductor substrate Ba, as shown in FIGS. 30 and 31. That is, the end of the conductive layers 71Ea-71Ei and the insulating layers 72Ea-72Ei in the row direction configures a wall portion WF.

(Method of Manufacturing the Nonvolatile Semiconductor Memory Device in Accordance with the Fifth Embodiment)

Next, a method of manufacturing the nonvolatile semiconductor memory device in accordance with the fifth embodiment is described with reference to FIGS. 40-45. FIGS. 40-45 are cross-sectional views showing a manufacturing process of the nonvolatile semiconductor memory device in accordance with the fifth embodiment.

Figure 40:
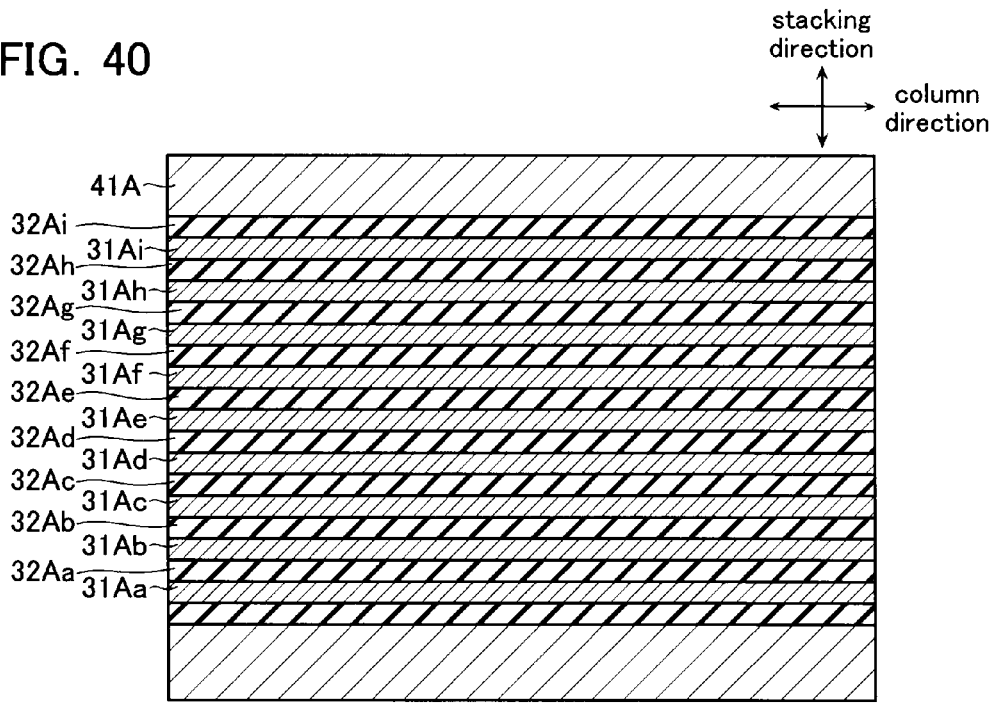
FIGS. 40-45 are cross-sectional views showing a manufacturing process of a nonvolatile semiconductor memory device in accordance with the fifth embodiment.

First, polysilicon (p-Si) and silicon oxide ($SiO_2$) are sequentially deposited to form the layers 31Aa-31Ai, the layers 32Aa-32Ai, and the layer 41A, as shown in FIG. 40. Next, the trench 301 is formed at the ends in the row direction of the memory region AR1, similarly to the process shown in FIG. 21 of the third embodiment. The trench 301 is formed extending in the column direction so as to penetrate the layers 31Aa-31Ai, the layers 32Aa-32Ai, and the layer 41A.

Figure 41:
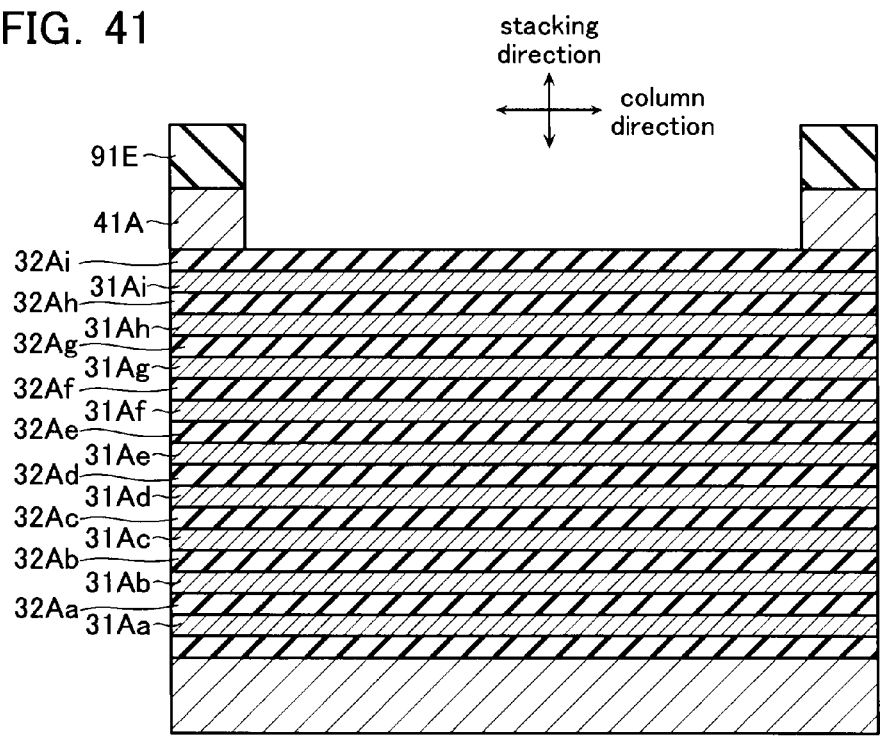

Then, a mask layer 91E is formed on the layer 41A except for a region for forming the stepped portion STe, as shown in FIG. 41. Next, etching is performed on the layer 41A using the mask layer 91E as a mask.

Figure 42:
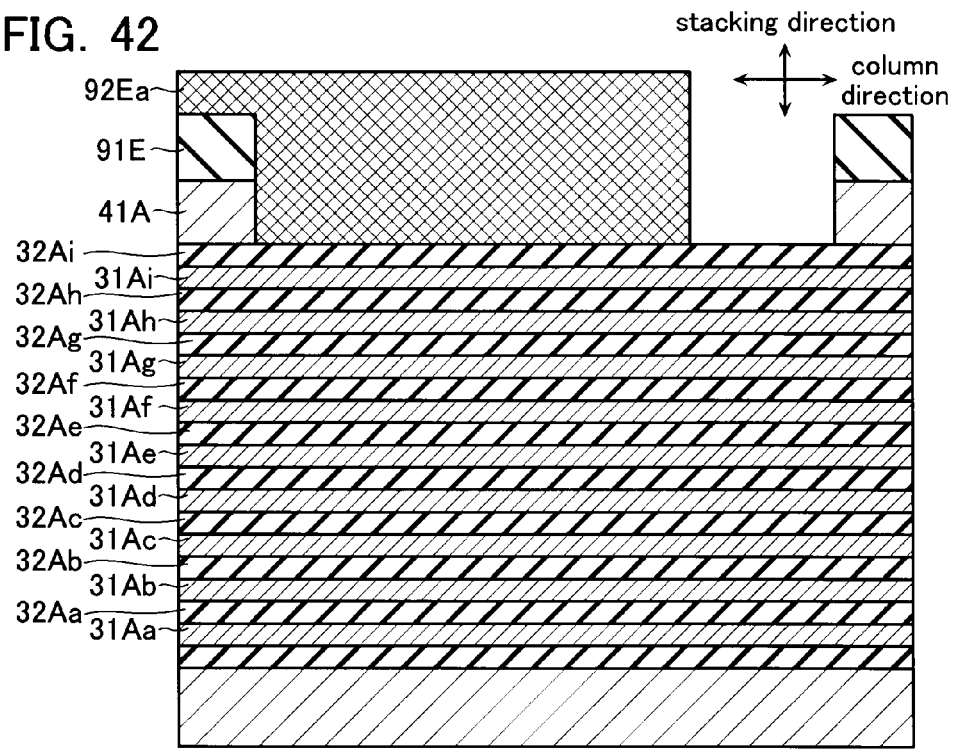
Figure 43:
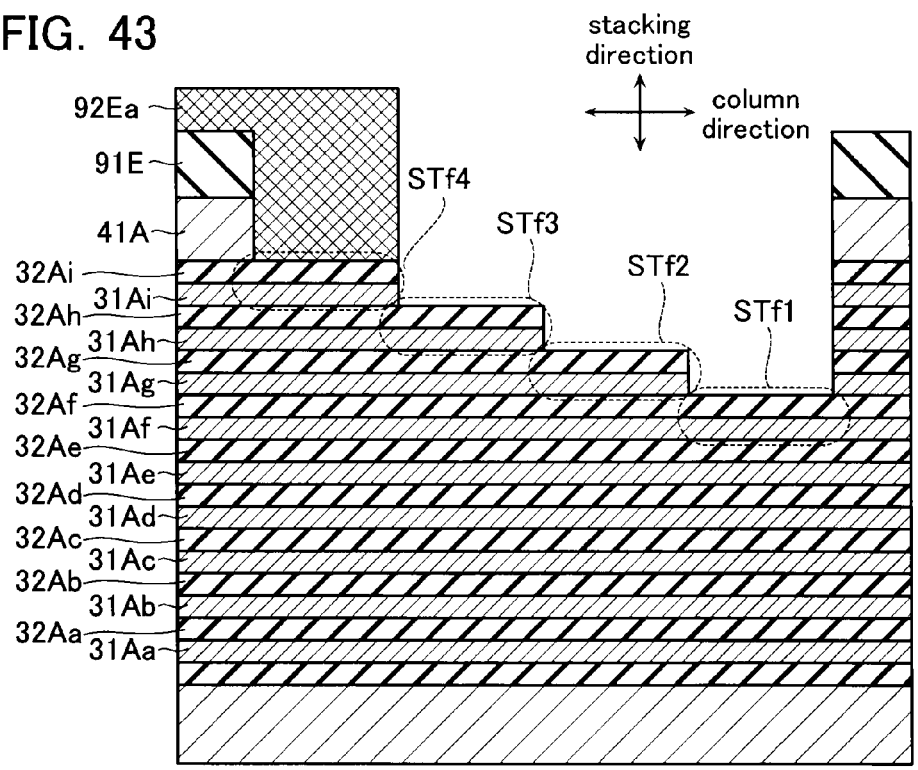
Figure 44:
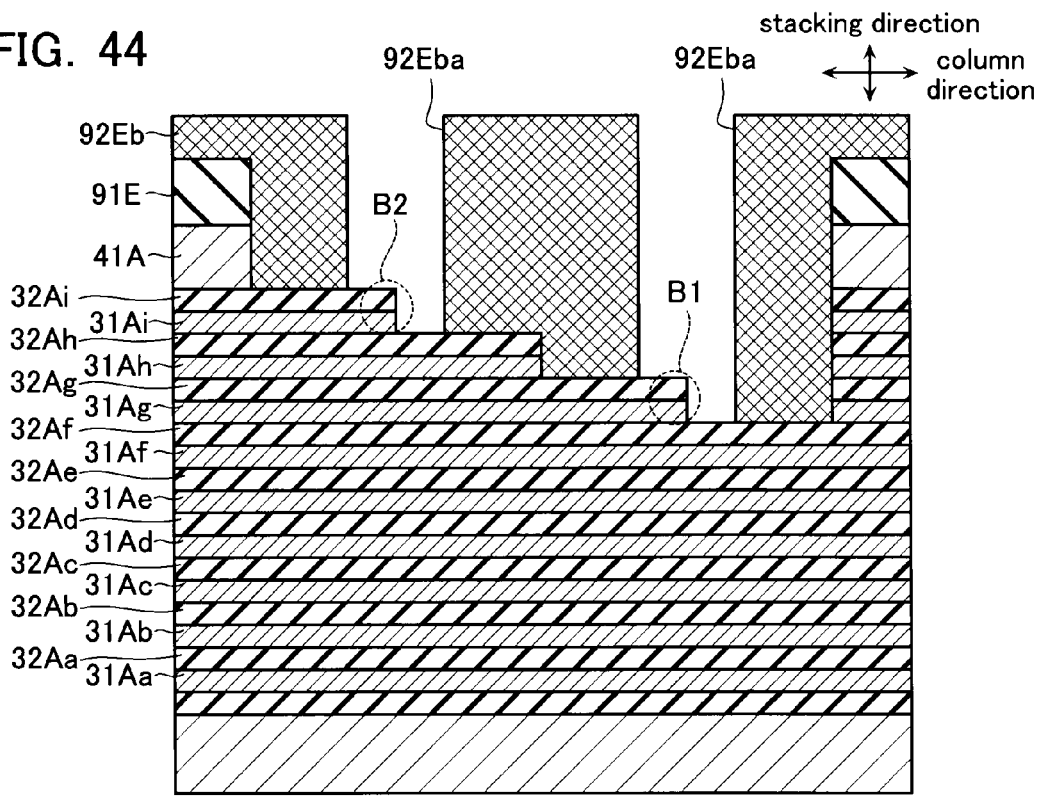

Subsequently, a resist layer 92Ea is formed, as shown in FIG. 42. Next, slimming of the resist layer 92Ea in the column direction and etching are repeatedly executed, as shown in FIG. 43. Here, a single etching is performed so as to penetrate one conductive layer and one insulating layer. Four steps STf1-STf4 are formed through this process. The step STf1 is configured by an end of the layer 31Af and an end of the layer 32Af; the step STf2 is configured by an end of the layer 31Ag and an end of the layer 32Ag; the step STf3 is configured by an end of the layer 31Ah and an end of the layer 32Ah; and the step STf4 is configured by an end of the layer 31Ai and an end of the layer 32Ai. Then, a resist layer 92Eb is formed, as shown in FIG. 44. The resist layer 92Eb is configured to include a trench 92Eba formed so as to penetrate the resist layer 92Eb. The trench 92Eba is formed at an upper portion of a level-difference B1 between the step STf1 and the step STf2, and at an upper portion of a level-difference B2 between the step STf3 and the step STf4.

Figure 45:
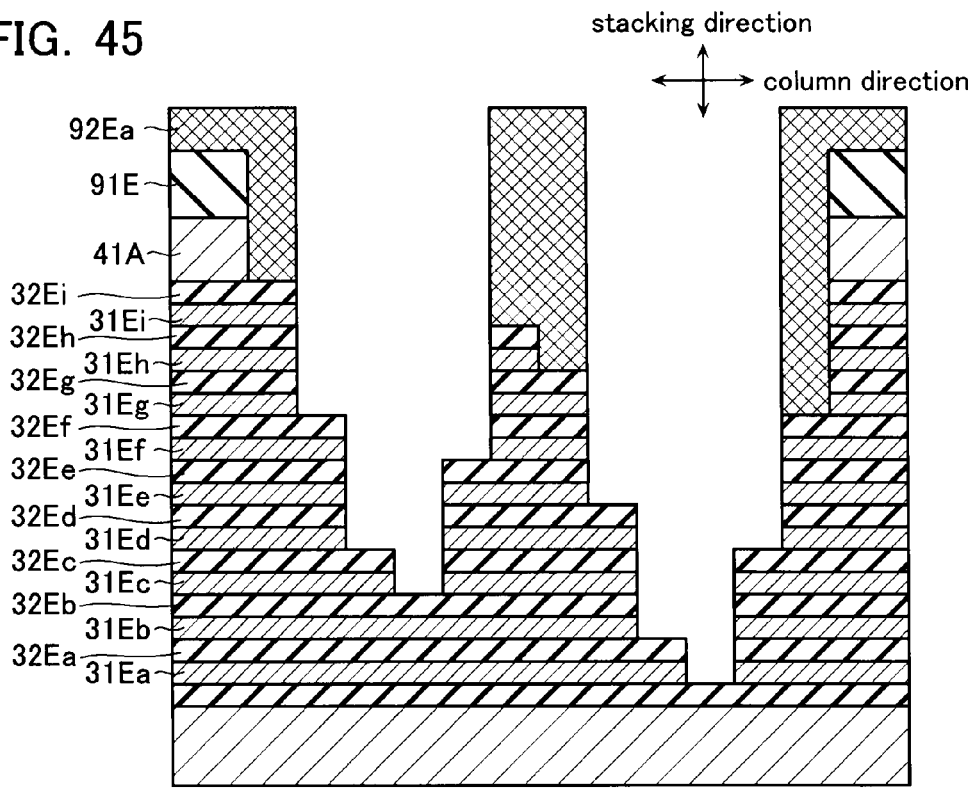

Next, slimming of the resist layer 92Eb from the trench 92Eba in the column direction and etching are repeatedly executed, as shown in FIG. 45. Here, a single etching is performed so as to penetrate three conductive layers and three insulating layers. Through this process, the layers 31Aa-31Ai become the first through ninth word line conductive layers 31Ea-31Ei; and the layers 32Aa-32Ai become the first through ninth inter-word line insulating layers 32Ea-32Ei.

(Advantages of the Nonvolatile Semiconductor Memory Device in Accordance with the Fifth Embodiment)

The nonvolatile semiconductor memory device in accordance with the fifth embodiment includes the stepped portion STe and the wall portion WE, and displays similar advantages to the first embodiment. Moreover, through the processes shown in FIGS. 44 and 45, the nonvolatile semiconductor memory device in accordance with the fifth embodiment is able to have a greater number of steps STe1-STe12 configured while reducing a number of processes, in comparison with the third embodiment.

[Sixth Embodiment]

(Configuration of a Nonvolatile Semiconductor Memory Device in Accordance with a Sixth Embodiment)

Figure 46:
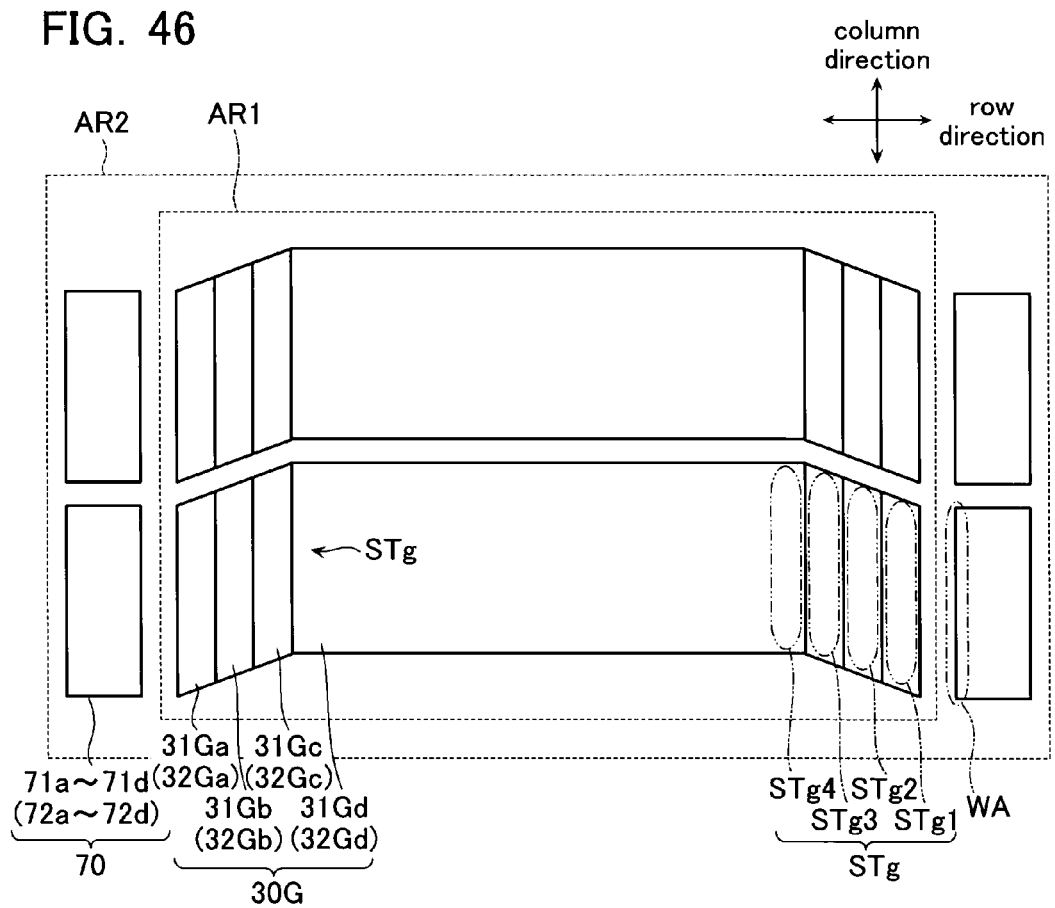
FIG. 46 is a top view showing a memory transistor layer 30G and the first dummy layer 70 in accordance with a sixth embodiment.

Next, a configuration of a nonvolatile semiconductor memory device in accordance with a sixth embodiment is described with reference to FIG. 46. The nonvolatile semiconductor memory device in accordance with the sixth embodiment has an overall configuration which is similar to that of the first embodiment (FIGS. 1-4); however, a configuration of a memory transistor layer 30G differs from that of the first embodiment. FIG. 46 is a top view showing the memory transistor layer 30G and the first dummy layer 70 in accordance with the sixth embodiment. Note that in the sixth embodiment, identical symbols are assigned to configurations similar to those in the first through fifth embodiments and descriptions thereof are omitted.

The memory transistor layer 30G includes first through fourth word line conductive layers 31Ga-31Gd and first through fourth inter-word line insulating layers 32Ga-32Gd, as shown in FIG. 46. The first through fourth word line conductive layers 31Ga-31Gd and the first through fourth inter-word line insulating layers 32Ga-32Gd are formed so as to extend two-dimensionally in the row direction and the column direction (in a plate-like shape), similarly to the first embodiment. A row-direction end of the first through fourth word line conductive layers 31Ga-31Gd and the first through fourth inter-word line insulating layers 32Ga-32Gd at the end vicinities of the memory region AR1 configures a stepped portion STg which differs from the first embodiment. The stepped portion STg includes steps STg1-STg4 arranged in a line in a direction having a certain angle with the row direction.

(Advantages of the Nonvolatile Semiconductor Memory Device in Accordance with the Sixth Embodiment)

The nonvolatile semiconductor memory device in accordance with the sixth embodiment includes the stepped portion STg and the wall portion WA, and displays similar advantages to the first embodiment. Moreover, the stepped portion STg in the sixth embodiment is formed in a direction having a certain angle with the row direction. Consequently, the contact plug layer 53 in the sixth embodiment can be disposed at a center of the respective steps STg1-STg4.

[Other Embodiments]

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

Figure 47:
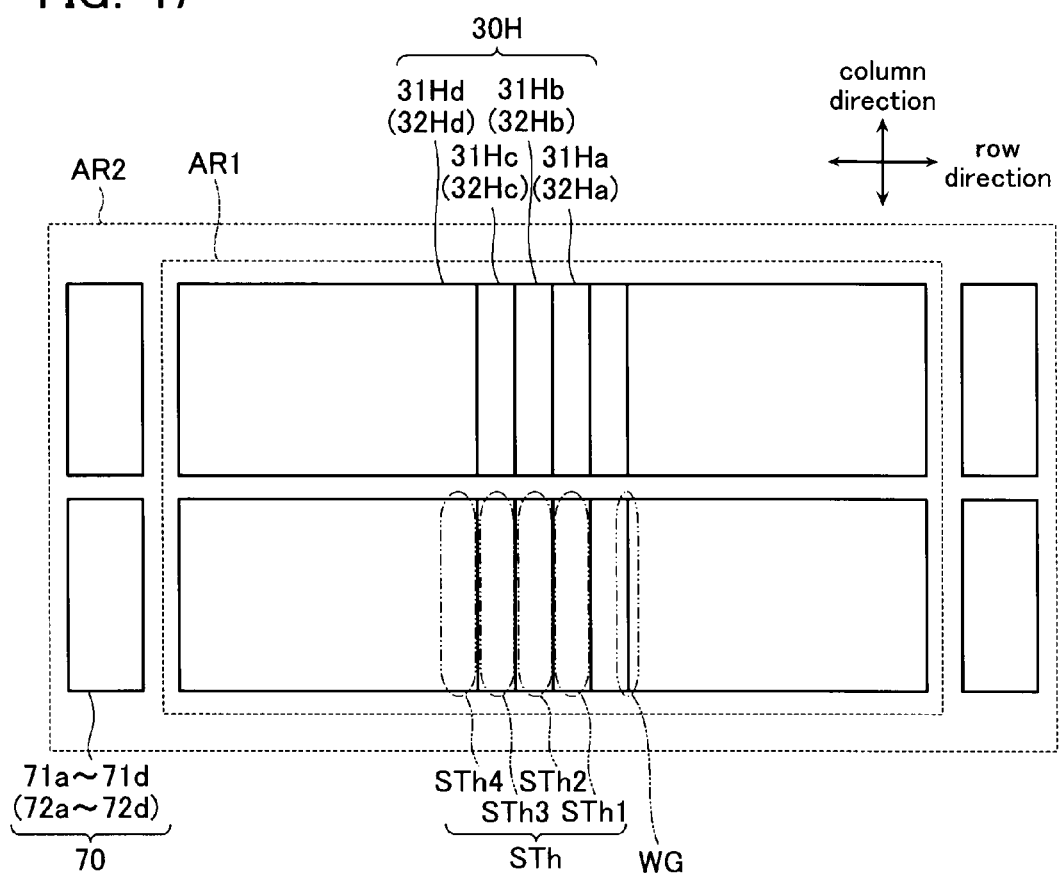
FIG. 47 is a top view showing a memory transistor layer 30H and the first dummy layer 70 in accordance with a variant example of the first embodiment.

For example, in the first through sixth embodiments, the stepped portions ST, STb, STc, STd, STe, and STg are provided at ends in the row direction of the memory region AR1. However, the nonvolatile semiconductor memory device in accordance with the present invention may have a configuration according to a variant example of the first embodiment shown in FIGS. 47 and 48. FIG. 47 is a top view showing a memory transistor layer 30H and the first dummy layer 70 in accordance with the variant example of the first embodiment, and FIG. 48 is a cross-sectional view of the memory region AR1 in accordance with same variant example.

Figure 48:
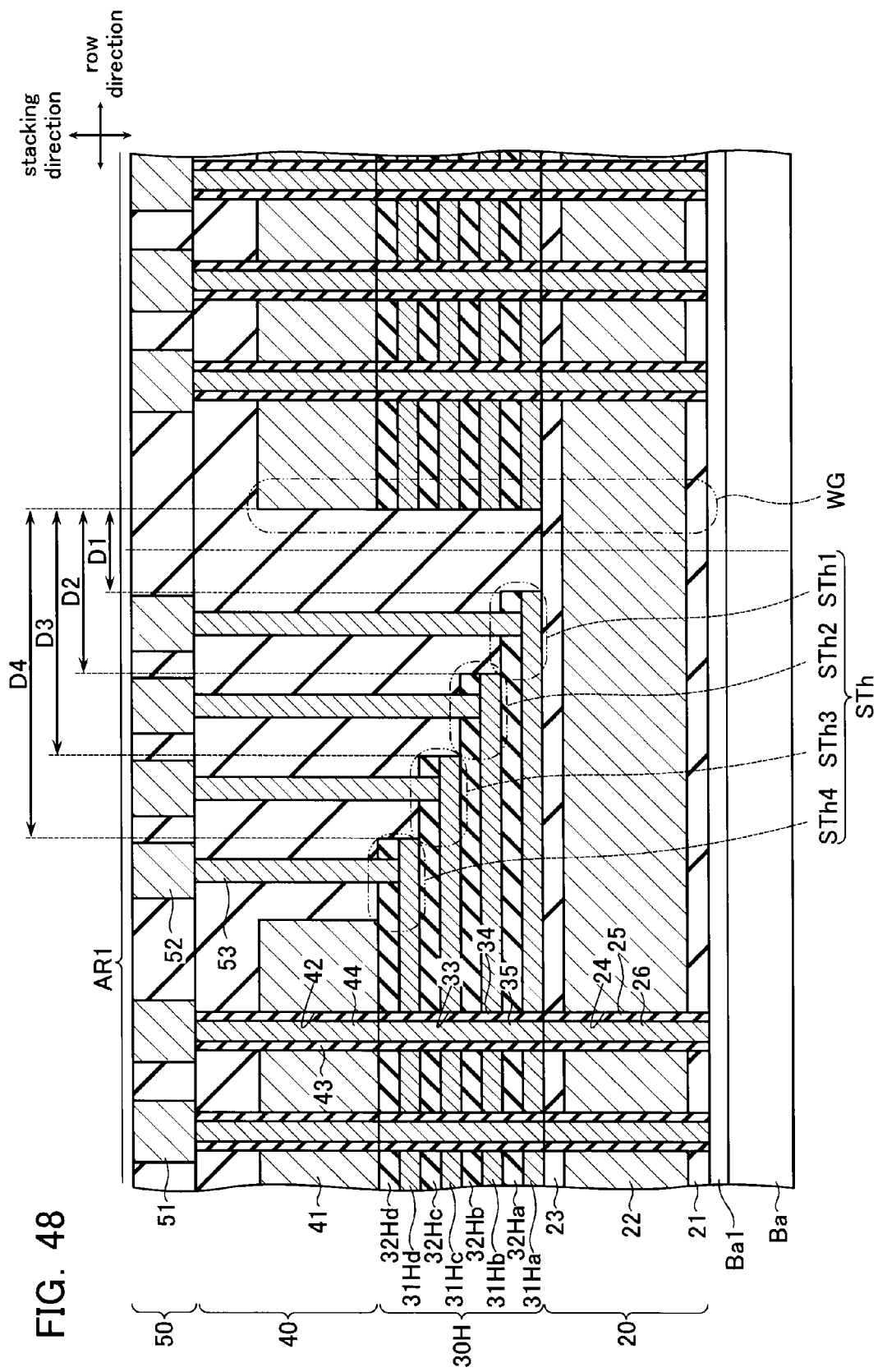
FIG. 48 is a cross-sectional view of a memory region AR1 in accordance with the variant example of the first embodiment.

In the variant example of the first embodiment, a stepped portion STh is provided at an internal region (region excluding an end) of the memory region AR1, as shown in FIGS. 47 and 48. The memory region AR1 includes the stepped portion STh and a wall portion WG. The stepped portion STh is where the first through fourth word line conductive layers 31Ha-31Hd (first through fourth inter-word line insulating layers 32Ha-32Hd) are formed in a stepped shape such that positions of ends thereof differ from one another. The wall portion WG is provided adjacently to the stepped portion STh and is a place formed by the first through fourth word line conductive layers 31Ha-31Hd such that positions of ends thereof are aligned in a direction substantially perpendicular to a substrate. Note that the configuration shown in FIGS. 47 and 48 may also be applied to the above-described second through sixth embodiments.

What is claimed is:

1. A nonvolatile semiconductor memory device, comprising:
a first region configured to function as a plurality of memory strings, each of which has a plurality of electrically rewritable memory cells connected in series; and
a second region provided in a periphery of the first region, the first region comprising:
a first semiconductor layer including a columnar portion extending in a perpendicular direction with respect to a substrate;

a charge storage layer formed on a side surface of the columnar portion; and a plurality of first conductive layers formed on the charge storage layer, and configured to function as a control electrode of the memory cells, and the second region comprising a plurality of second conductive layers formed in the same layer as the plurality of first conductive layers, the plurality of first conductive layers configuring a stepped portion at an end vicinity of the first region, the stepped portion being formed in a stepped shape such that positions of ends of the plurality of first conductive layers differ from one another, and the plurality of second conductive layers being formed such that positions of ends thereof at an end vicinity of the second region surrounding the first region are aligned in substantially the perpendicular direction to the substrate.

2. The nonvolatile semiconductor memory device according to claim 1, wherein the stepped portion includes a plurality of steps arranged in a line in a first direction parallel to the substrate.

3. The nonvolatile semiconductor memory device according to claim 1, further comprising a select transistor connected to one end of the memory strings, the select transistor comprising:

a second semiconductor layer extending from the columnar portion in the perpendicular direction;

a gate insulating layer formed on a side surface of the second semiconductor layer; and a third conductive layer formed on the gate insulating layer and configured to function as a control electrode of the select transistor, the third conductive layer being formed in stripes parallel to the substrate, the stripes having a certain pitch in a second direction and extending in a third direction orthogonal to the second direction.

4. The nonvolatile semiconductor memory device according to claim 3, wherein the stepped portion includes a plurality of steps arranged in a line in the second direction.

5. The nonvolatile semiconductor memory device according to claim 3, wherein the stepped portion includes a plurality of steps arranged in a line in the third direction.

6. The nonvolatile semiconductor memory device according to claim 1, wherein the stepped portion includes a plurality of steps arranged in a matrix in a fourth direction and a fifth direction parallel to the substrate.

7. The nonvolatile semiconductor memory device according to claim 2, wherein the stepped portion comprises:

a first stepped portion formed so as to decrease in height in a stepwise manner proceeding from a first position to a second position in the first direction, and to increase in height in a stepwise manner proceeding from the second position to a third position in the first direction; and a second stepped portion formed so as to decrease in height in a stepwise manner proceeding from the third position to a fourth position in the first direction, and to increase in height in a stepwise manner proceeding from the fourth position to a fifth position in the first direction, the first stepped portion and the second stepped portion each having an asymmetrical shape.

8. A nonvolatile semiconductor memory device, comprising:

a first region configured to function as a plurality of memory strings, each of which has a plurality of electrically rewritable memory cells connected in series, the first region comprising:

a semiconductor layer including a columnar portion extending in a perpendicular direction with respect to a substrate;

a charge storage layer formed on a side surface of the columnar portion;

a plurality of conductive layers formed on the charge storage layer, and configured to function as a control electrode of the memory cells;

a stepped portion having the plurality of conductive layers formed in a stepped shape such that positions of ends of the plurality of conductive layers differ from one another; and a wall portion provided adjacently to the stepped portion and formed by the plurality of conductive layers such that positions of ends of the plurality of conductive layers are aligned in substantially the perpendicular direction to the substrate;

wherein the stepped portion comprises:

a first stepped portion formed so as to decrease in height in a stepwise manner proceeding from a first position to a second position in the first direction, and to increase in height in a stepwise manner proceeding from the second position to a third position in the first direction; and a second stepped portion formed so as to decrease in height in a stepwise manner proceeding from the third position to a fourth position in the first direction, and to increase in height in a stepwise manner proceeding from the fourth position to a fifth position in the first direction, the first stepped portion and the second stepped portion each having an asymmetrical shape.

9. The nonvolatile semiconductor memory device according to claim 1, wherein the second region is insulated from the first region.

* * * * *